US012751042B2

(12) United States Patent
Woo et al.

(10) Patent No.: US 12,751,042 B2
(45) Date of Patent: Sep. 29, 2026

(54) POWER SEMICONDUCTOR DEVICE INCLUDING A SEMICONDUCTOR LAYER BASED ON SILICON CARBIDE

(71) Applicant: HYUNDAI MOBIS Co., Ltd., Seoul (KR)

(72) Inventors: Hyuk Woo, Yongin-si (KR); Tae Yeop Kim, Yongin-si (KR); Ju Hwan Lee, Yongin-si (KR); Min Gi Kang, Yongin-si (KR); Jeong Mok Ha, Yongin-si (KR); Tae Yang Kim, Yongin-si (KR); Sin A Kim, Yongin-si (KR)

(73) Assignee: HYUNDAI MOBIS CO., LTD., Seoul (KR)

( * ) Notice: Subject to any disclaimer, the term of this patent is extended or adjusted under 35 U.S.C. 154(b) by 658 days.

(21) Appl. No.: 17/837,547

(22) Filed: Jun. 10, 2022

(65) Prior Publication Data

US 2023/0012361 A1 Jan. 12, 2023

(30) Foreign Application Priority Data

Jul. 8, 2021 (KR) ........................ 10-2021-0089752
Jul. 8, 2021 (KR) ........................ 10-2021-0089762
(Continued)

(51) Int. Cl.
*H10D 30/66* (2025.01)
*H10D 12/01* (2025.01)
(Continued)

(52) U.S. Cl.
CPC ......... *H10D 30/668* (2025.01); *H10D 12/031* (2025.01); *H10D 62/106* (2025.01); *H10D 62/127* (2025.01); *H10D 62/8325* (2025.01)

(58) Field of Classification Search
CPC ............. H01L 29/7813; H01L 29/0619; H01L 29/0696; H01L 29/1608; H01L 29/66068;
(Continued)

(56) References Cited

U.S. PATENT DOCUMENTS 6,525,375 B1 * 2/2003 Yamaguchi .......... H10D 84/141 257/E29.255
2014/0124830 A1 * 5/2014 Rahimo .............. H01L 29/7397 438/138
(Continued)

FOREIGN PATENT DOCUMENTS

CN 101719495 A 6/2010
CN 106158927 A 11/2016
(Continued)

OTHER PUBLICATIONS

Office Actions issued in Korean Patent Application No. 10-2021-0152543 dated Jan. 15, 2023, with English translations.
(Continued)

*Primary Examiner* — Mohammad M Hoque
(74) *Attorney, Agent, or Firm* — MORGAN, LEWIS & BOCKIUS LLP

(57) ABSTRACT

A power semiconductor device includes a semiconductor layer based on silicon carbide (SiC), a vertical drift region positioned to extend in a vertical direction inside the semiconductor layer and having a first conductive type, a well region positioned in at least one side of the vertical drift region to make contact with the vertical drift region and having a second conductive type, recess gate electrodes extending from a surface of the semiconductor layer into the semiconductor layer and buried in the vertical drift region and the well region to cross the vertical drift region and the well region in a first direction, source regions positioned in the well region between the recess gate electrodes and having the first conductive type, and insulating-layer pro-
(Continued)

tective regions surrounding lower portions of the recess gate electrodes, respectively, in the vertical drift region, and having the second conductive type.

15 Claims, 44 Drawing Sheets

(30) Foreign Application Priority Data

| | | |
|---|---|---|
| Jul. 8, 2021 | (KR) | 10-2021-0089773 |
| Jul. 8, 2021 | (KR) | 10-2021-0089774 |
| Jul. 8, 2021 | (KR) | 10-2021-0089780 |
| Nov. 8, 2021 | (KR) | 10-2021-0152543 |
| Dec. 16, 2021 | (KR) | 10-2021-0180982 |
| Dec. 16, 2021 | (KR) | 10-2021-0180983 |
| Dec. 27, 2021 | (KR) | 10-2021-0188767 |
| Jan. 21, 2022 | (KR) | 10-2022-0009225 |

(51) Int. Cl.
*H10D 62/10* (2025.01)
*H10D 62/832* (2025.01)

(58) Field of Classification Search
CPC ............ H01L 29/0649; H01L 29/7397; H01L 29/0634; H01L 29/4236; H01L 29/7802; H01L 29/7827; H01L 29/0615; H10D 30/668; H10D 12/031; H10D 62/106; H10D 62/127; H10D 62/8325; H10D 30/66; H10D 12/481; H10D 64/513; H10D 62/115; H10D 62/111; H10D 62/105; H10D 30/63
USPC .......................................................... 257/409
See application file for complete search history.

(56) References Cited

U.S. PATENT DOCUMENTS

2015/0129893 A1 5/2015 Nakano
2018/0342587 A1* 11/2018 Okumura ............ H01L 29/1608
2018/0350976 A1* 12/2018 Okumura ............ H01L 29/1608
2020/0303507 A1* 9/2020 Yilmaz ................ H10D 30/665

FOREIGN PATENT DOCUMENTS

| | | | | | |
|---|---|---|---|---|---|
| DE | 10 2021 113 470 | A1 | | 12/2021 | |
| JP | 2002-083963 | A | | 3/2002 | |
| JP | 2010-109296 | A | | 5/2010 | |
| JP | 2015-115337 | A | | 6/2015 | |
| JP | 2015162577 | A | * | 9/2015 | H01L 29/0623 |
| JP | 2018-201013 | A | | 12/2018 | |
| JP | 2018-206923 | A | | 12/2018 | |
| JP | 2019121705 | A | * | 7/2019 | |
| KR | 10-2001-0017801 | A | | 3/2001 | |
| KR | 10-2010-0105329 | A | | 9/2010 | |
| KR | 10-2011-0087392 | A | | 8/2011 | |
| KR | 10-2014-0042858 | A | | 4/2014 | |
| KR | 10-2018-0016532 | A | | 2/2018 | |
| KR | 10-2019-0068627 | A | | 6/2019 | |
| WO | 2016/107504 | A1 | | 7/2016 | |

OTHER PUBLICATIONS

Office Actions issued in Korean Patent Application No. 10-2021-0180983 dated Feb. 6, 2023, with English translations.
Office Action issued in corresponding Korean Patent Application No. 10-2022-0009225 dated Jun. 20, 2025, with English translation.
Office Action issued in corresponding Korean Patent Application No. 10-2021-0180982 dated Jul. 21, 2025, with English translation.
Office Action issued in corresponding Korean Patent Application No. 10-2021-0188767 dated Jul. 23, 2025, with English translation.
Office Action issued in corresponding German Patent Application No. 10 2022 205 327.3 dated Oct. 31, 2025.
Office Action issued in corresponding Korean Patent Application No. 10-2022-0009225 dated Dec. 3, 2025, with English translation.
Notice of Allowance issued in corresponding Chinese Patent Application No. 202210645131.X dated Jul. 1, 2026.
Notice of Allowance issued in corresponding Chinese Patent Application No. 202210645131.X dated Jul. 1, 2026, English translation (Original reference submitted Jul. 14, 2026).

* cited by examiner

POWER SEMICONDUCTOR DEVICE INCLUDING A SEMICONDUCTOR LAYER BASED ON SILICON CARBIDE

CROSS-REFERENCE TO RELATED APPLICATION

This application claims the benefit of priority to Korean Patent Application Nos. 10-2021-0089752, 10-2021-0152543, 10-2021-0089762, 10-2021-0180982, 10-2021-0089773, 10-2021-0180983, 10-2021-0089774, 10-2021-0188767, 10-2021-0089780 and 10-2022-0009225 filed in the Korean Intellectual Property Office on Jul. 8, 2021, Nov. 8, 2021, Jul. 8, 2021, Dec. 16, 2021, Jul. 8, 2021, Dec. 16, 2021, Jul. 8, 2021, Dec. 27, 2021, Jul. 8, 2021 and Jan. 21, 2022 the entire contents of which are incorporated herein by reference.

TECHNICAL FIELD

The present disclosure relates to a semiconductor device, and more particularly, relates to a power semiconductor device capable of switching power transmission and a method for fabricating the same.

BACKGROUND

A power semiconductor device refers to a semiconductor device that operates in a high-voltage and high-current environment. The power semiconductor device has been used in a field, such as power transform, a power converter, or an inverter, requiring high-power switching. For example, the power semiconductor device may include an insulated gate bipolar transistor (IGBT), or a metal oxide semiconductor field effect transistor (MOSFET). The power semiconductor device basically requires a withstand characteristic against a higher voltage. In addition, recently, a high-speed switching operation has been additionally required for the power semiconductor device.

Accordingly, studies and researches have been performed regarding a power semiconductor device using silicon carbide (SiC) instead of conventional silicon (Si). Silicon carbide (SiC), which is a wide gap semiconductor material having a bandgap higher than that of silicon, may maintain stability even at a higher temperature, as compared to silicon. Further, silicon carbide (SiC) exhibits a dielectric breakdown field remarkably higher than that of silicon (Si). Accordingly, silicon carbide (SiC) may stably work even at a higher voltage. Therefore, silicon carbide (SiC) has a higher breakdown voltage than that of silicon (Si), and exhibits excellent heat dissipation. Accordingly, silicon carbide (SiC) is able to operate at a high temperature.

To increase a channel density of a power semiconductor device based on silicon carbide (SiC), a trench type of gate structure having a vertical channel structure has been studied. The trench type of gate structure has a problem in which an electric field is concentrated to a trench corner.

SUMMARY

The present disclosure has been made to solve the above-mentioned problems occurring in the prior art while advantages achieved by the prior art are maintained intact.

An aspect of the present disclosure provides a power semiconductor device based on silicon carbide (SiC), capable of mitigating the concentration of an electric field, increasing a channel density, and reducing a channel resistance, and a method for fabricating the same. However, the above object is an example, and the scope and spirit of the present disclosure is not limited thereto.

The technical problems to be solved by the present disclosure are not limited to the aforementioned problems, and any other technical problems not mentioned herein will be clearly understood from the following description by those skilled in the art to which the present disclosure pertains.

According to an aspect of the present disclosure, a power semiconductor device may include a semiconductor layer based on silicon carbide (SiC), a vertical drift region positioned to extend in a vertical direction inside the semiconductor layer and having a first conductive type, a well region at least positioned at one side of the vertical drift region to make contact with the vertical drift region in the semiconductor layer and having a second conductive type opposite to the first conductive type, a plurality of recess gate electrodes extending from a surface of the semiconductor layer into the semiconductor layer and buried in the vertical drift region and the well region to cross the vertical drift region and the well region in a first direction, a plurality of source regions positioned in the well region between the plurality of recess gate electrodes and having the first conductive type, and a plurality of insulating-layer protective regions positioned at least under the plurality of recess gate electrodes, respectively, in the vertical drift region, and having the second conductive type.

Preferably, the insulating-layer protective regions may have forms to surround lower portions of the recess gate electrodes.

Preferably, the power semiconductor device may further include a pillar region positioned under the well region to make contact with the vertical drift region and the well region in the semiconductor layer, and having the second conductive type.

Preferably, a first region of the vertical drift region may have a width wider than a width of a second region of the vertical drift region. The first region is in contact with the pillar region, and the second region is in contact with the well region.

Preferably, the power semiconductor device may further include a horizontal drift region connected to the vertical drift region, and positioned under the pillar region to make contact with the pillar region.

Preferably, the well region and the source regions may be positioned at opposite sides of the vertical drift region to be symmetric to each other about the vertical drift region.

Preferably, the power semiconductor device may further include a source contact region disposed outside the recess gate electrodes and connected to the plurality of source regions.

Preferably, the power semiconductor device may further include a well contact region positioned in the source contact region and connected to the well region.

Preferably, the power semiconductor device may further include source electrode layers connected to the source contact region and the well contact region.

Preferably, the plurality of recess gate electrodes may be positioned to extend to a partial region of the well region while passing through the vertical drift region in the first direction, and may be disposed to be spaced apart from each other in a second direction crossing the first direction.

Preferably, the plurality of insulating-layer protective regions may be positioned to cross an entire portion of the vertical drift region in the first direction, and may be positioned to be spaced apart from each other without being connected to each other in the second direction.

Preferably, the power semiconductor device may further include a plate gate electrode positioned on the semiconductor layer while connecting the plurality of recess gate electrodes to each other.

Preferably, the plate gate electrode may be positioned on the semiconductor layer to cover the vertical drift region and the plurality of source regions.

Preferably, the plurality of source regions may be positioned to be spaced apart from the vertical drift region by a specific distance.

Preferably, the plurality of source regions may be positioned to make contact with the vertical drift region.

According to another aspect of the present disclosure, a power semiconductor device may include a semiconductor layer including silicon carbide (SiC), recess gates extending from a surface of the semiconductor layer into the semiconductor layer, drift regions positioned between the recess gates in the semiconductor layer, and having a first conductive type, well regions positioned at at least one side of the drift regions to make contact with the drift regions, between the recess gates and having a second conductive type opposite to the first conductive type, source regions positioned in the well regions between the recess gates, and having the first conductive type, first pillar regions positioned under the drift regions and the well regions to be connected to the drift regions in the semiconductor layer, and having the first conductive type, and second pillar regions connected to the well regions in the semiconductor layer, positioned under the recess gates, and having the second conductive type.

Preferably, the second pillar regions may surround lower portions of the recess gates.

Preferably, the first pillar regions and the second pillar regions may be alternately arranged while making contact with each other in a first direction.

Preferably, the first pillar regions and the second pillar regions may extend to be longer than the recess gates in a second direction crossing the first direction.

According to another aspect of the present disclosure, a power semiconductor device may include a semiconductor layer including silicon carbide (SiC) and having a first conductive type, a recess gate positioned in a trench extending from a surface of the semiconductor layer into the semiconductor layer, a first impurity region including impurities in a second conductive type opposite to the first conductive type and surrounding a lower corner region of the trench, and a second impurity region including first conductive type of impurities and positioned at opposite sides of the trench to make contact with the opposite sides of the trench.

BRIEF DESCRIPTION OF THE DRAWINGS

The above and other objects, features and advantages of the present disclosure will be more apparent from the following detailed description taken in conjunction with the accompanying drawings.

DETAILED DESCRIPTION

Figure 1:
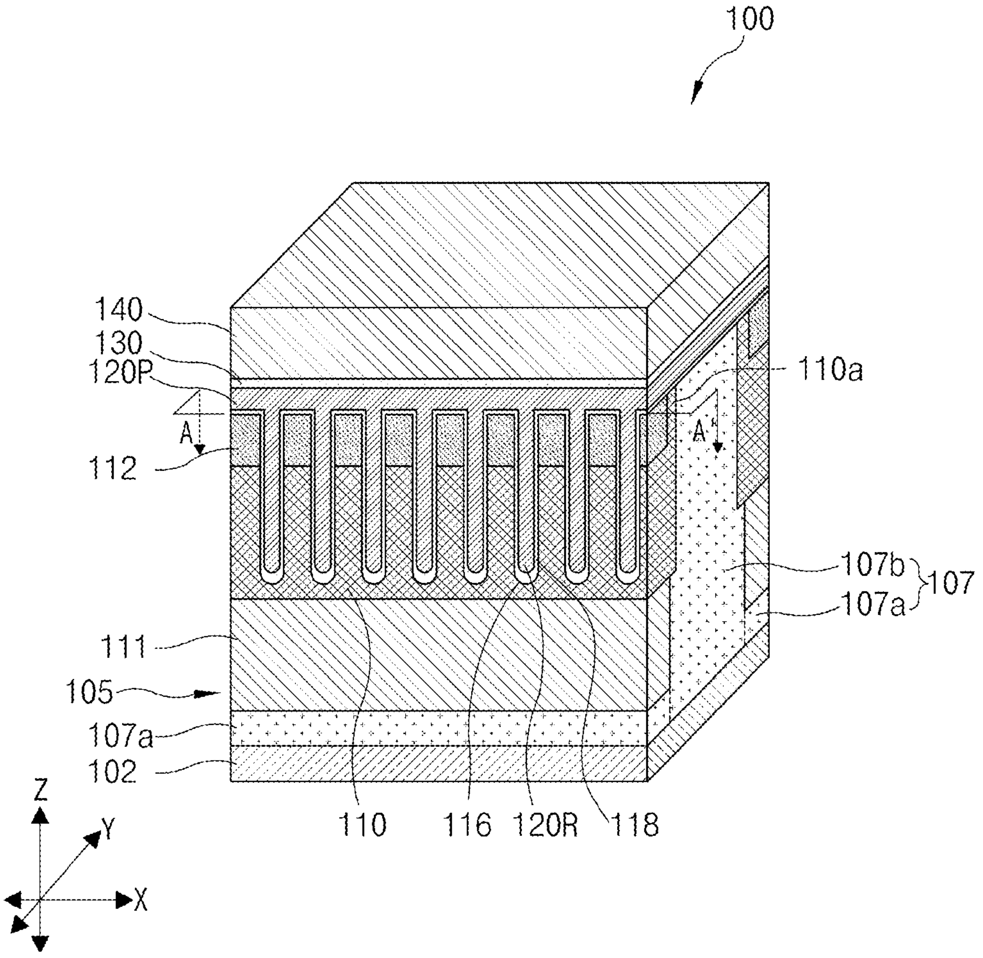
FIG. 1 is a perspective view schematically illustrating the structure of a power semiconductor device, according to an embodiment of the present disclosure.

Hereinafter, embodiments of the present disclosure will be described with reference to accompanying drawings. However, the present disclosure may be embodied in various different forms, and should not be construed as being limited only to the following illustrated embodiments. Rather, the following embodiments are provided as examples so that this disclosure will be thorough and complete, and will fully convey the concept of the present disclosure to those skilled in the art. For the convenience of explanation, some components in accompanying drawings may be exaggerated or reduced in size. The same reference numerals will be assigned to the same components in drawings.

Unless otherwise defined, all terms used herein are to be interpreted as commonly understood by one skilled in the art. In accompanying drawings, the sizes of a layer and a region are exaggerated for convenience of explanation for general structures in the present disclosure.

The same reference signs indicate the same components. It will be understood that, when a component, such as a layer, a region, or a substrate, is referred to as being "on" another component, the component can be "directly" or "indirectly" on the another component, or one or more intervening components may also be present between the component and the another component. To the contrary, when one component is described as being directly on another component, it is understood as any intermediate component is not interposed therebetween.

Figure 2:
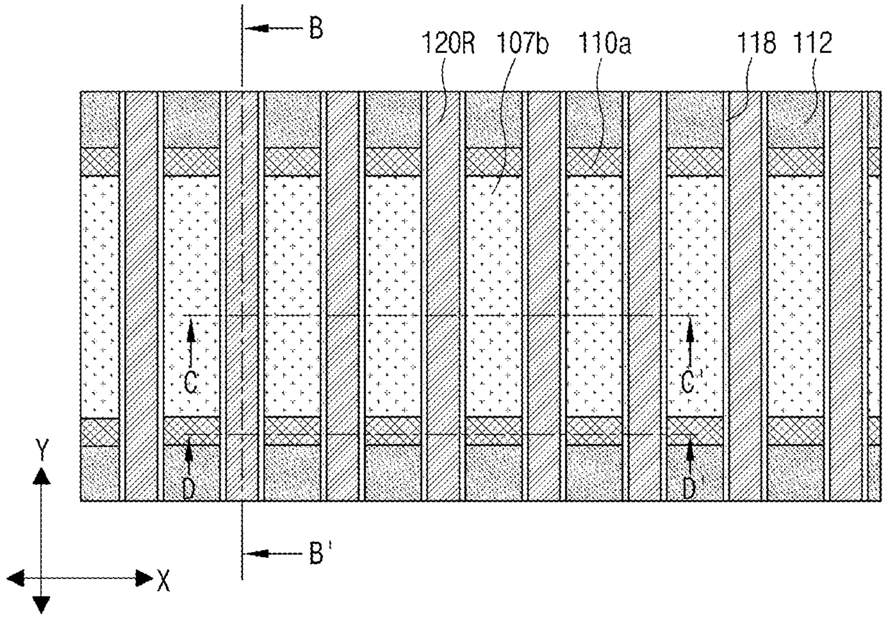
FIG. 2 is a cross-sectional view illustrating the structure taken along line A-A' of FIG. 1.
Figure 3:
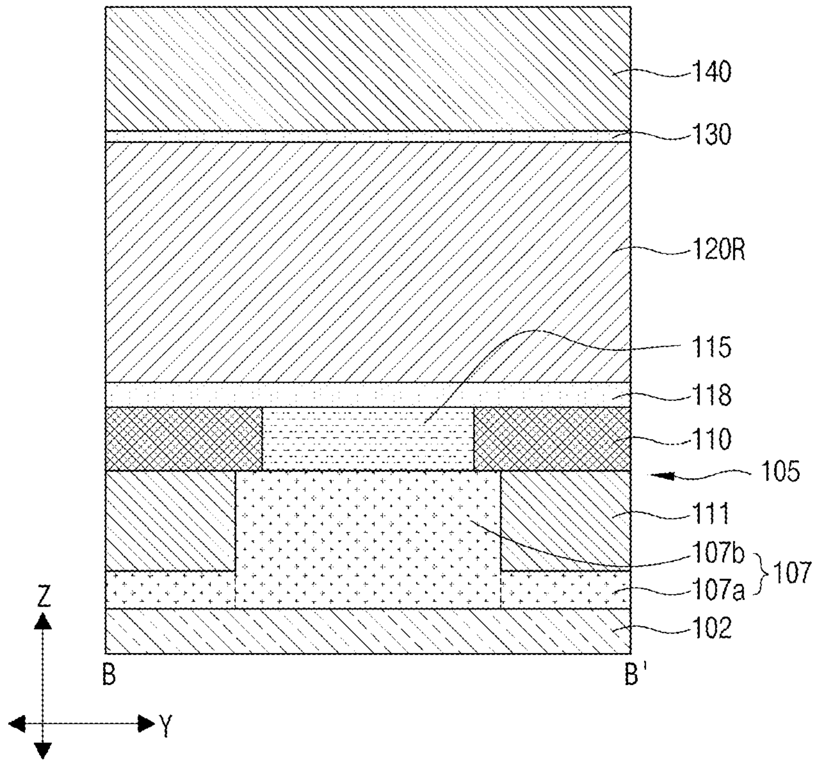
FIG. 3 is a longitudinal-sectional view illustrating the structure taken along line B-B' of FIG. 2.
Figure 4:
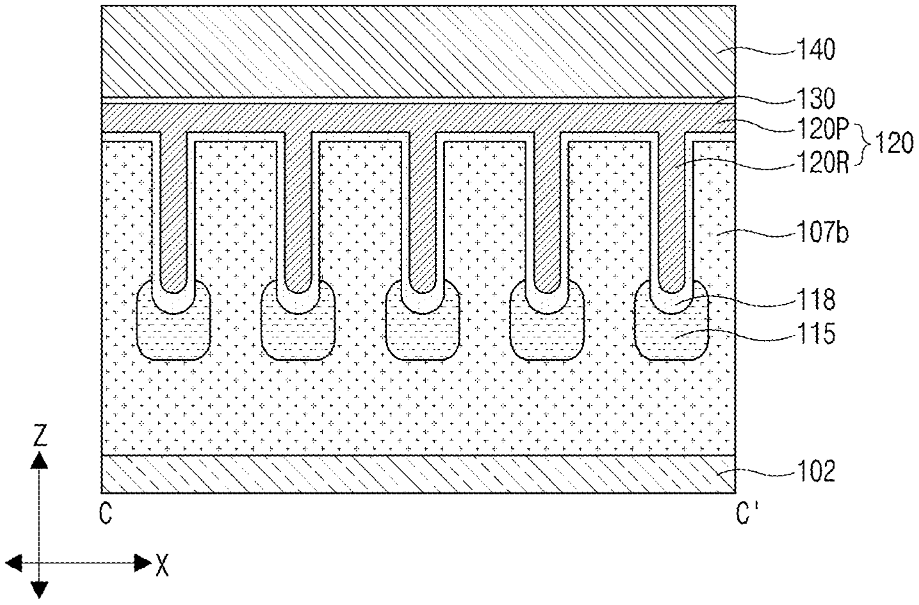
FIG. 4 is a longitudinal-sectional view illustrating the structure taken along line C-C' of FIG. 2.
Figure 5:
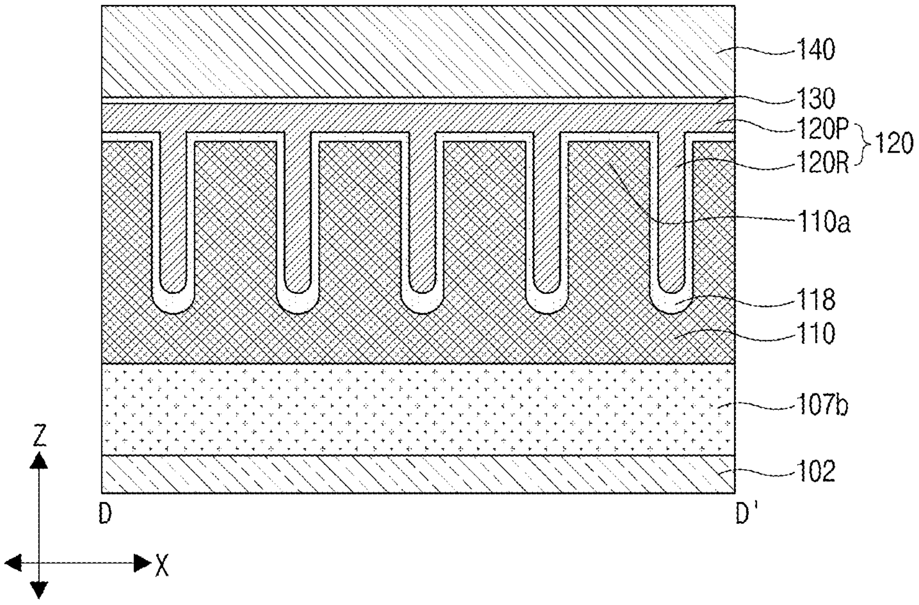
FIG. 5 is a longitudinal-sectional view illustrating the structure taken along line D-D' of FIG. 2.

FIG. 1 is a perspective view schematically illustrating the structure of a power semiconductor device, according to an embodiment of the present disclosure, and FIG. 2 is a cross-sectional view illustrating the structure taken along line A-A' of FIG. 1. FIGS. 3 to 5 are longitudinal sectional views illustrating the structure taken along lines B-B', C-C', and D-D' of FIG. 2.

Referring to FIGS. 1 to 5, a power semiconductor device 100 may include a semiconductor layer 105, a gate insulating layer 118, a gate electrode layer 120, an interlayer insulating layer 130, and a source electrode layer 140. For example, the power semiconductor device 100 may have a power MOSFET structure.

The semiconductor layer 105 may include a single semiconductor material layer or a plurality of semiconductor material layers. For example, the semiconductor layer 105 may include a single epitaxial layer or multiple epitaxial layers. Alternatively, the semiconductor layer 105 may include a single epitaxial layer or multiple epitaxial layers formed on a semiconductor substrate. For example, the semiconductor layer 105 may include silicon carbide (SiC). Alternatively, the semiconductor layer 105 may include at least one SiC-epitaxial layer.

Silicon carbide (SiC), which is a wide gap semiconductor material having a bandgap higher than a bandgap of silicon (Si), may maintain stability even at a higher temperature, as compared to silicon (Si). Further, silicon carbide (SiC) exhibits a dielectric breakdown field remarkably higher than that of silicon (Si). Accordingly, silicon carbide (SiC) may stably work even at a higher voltage. Accordingly, the power semiconductor device 100 having the semiconductor layer 105 based on silicon carbide (SiC) may exhibit a more excellent heat dissipation characteristic with a higher breakdown voltage, and may exhibit a stable operating characteristic at a higher temperature, when compared to silicon (Si).

Such a semiconductor layer 105 may include a drift region 107. The drift region 107 may be formed in a first conductive type (N-type) and may be formed by implanting impurities (a first conductive type of impurities) in the first conductive type into a portion of the semiconductor layer 105. For example, the drift region 107 may be formed by implanting the first conductive type of impurities into the SiC epitaxial layer.

The drift region 107 may provide a moving path of a current, when the power semiconductor device 100 operates. The drift region 107 may include a horizontal part **107*a*, which is formed to extend in a horizontal direction at a lower portion of the semiconductor layer 105, thereby providing a horizontal moving path of a current, and a vertical part 107*b* formed to be connected to the horizontal part 107*a* while extending in a vertical direction (a Z direction) inside the semiconductor layer 105, thereby providing a vertical moving path of a current. For example, in the drift region 107, the horizontal part 107*a* may correspond to a region positioned under a pillar region 111, and the vertical part 107*b* may correspond to a region positioned to make contact with the horizontal part 107*a*, a well region 110, and lateral sides of the pillar region 111**.

In this case, the vertical part **107*b* may include a plurality of regions (divided vertical parts) divided by recess gate electrodes 120R. In the power semiconductor device according to the present embodiment, each of the plurality of divided vertical parts 107*b*** may be used as vertical moving paths of a current.

The well region 110 may be contact with the drift region 107 in the semiconductor layer 105, and may include impurities (a second conductive type of impurities) in a second conductive type. For example, the well region 110 may be formed by implanting impurities in the second conductive type (the P type), which is opposite to the first conductive type, into the SiC-epitaxial layer.

For example, the well region 110 may be formed to surround at least a portion of the drift region 107. For example, the well region 110 may be formed to surround an upper portion of the vertical part **107*b* in the drift region 107. Although FIG. 1 illustrates the well region 110 is divided into two regions spaced apart from each other by a specific distance in a Y direction, by the vertical part 107*b*, various modifications are possible. For example, the well region 110 may be provided in an all-around form to surround lateral sides of the vertical part 107*b***.

The pillar region 111 may be formed under the well region 110 in the semiconductor layer 105 such that the pillar region 111 is connected to the well region 110. The pillar region 111 may be formed to make contact with the drift region 107 to form a super junction with the drift region 107. For example, the pillar region 111 may be disposed under the well region 110 such that a top surface of the pillar region 111 makes contact with the well region 110, and a lateral side and a bottom surface of the pillar region 111 make contact with the vertical part **107*b* and the horizontal part 107*a* of the drift region 107**, respectively.

The pillar region 111 may be formed in the semiconductor layer 105 to have a conductive type opposite to the conductive type of the drift region 107 such that the pillar region 111 forms the super junction with the drift region 107. For example, the pillar region 111 may include the second conductive type of impurities opposite to that of the drift region 107 and the same as that of the well region 110. For example, the doping concentration of the second conductive type of impurities of the pillar region 111 may be equal to or lighter than the doping concentration of the second conductive type of impurities of the well region 110.

According to an embodiment, the pillar region 111 may be formed to have a width narrower than a width of the well region 110 in one direction (the Y direction). For example, when the well regions 110 and the pillar regions 111 are formed to be spaced apart from each other at opposite sides of the vertical part 107*b*, the distance (the distance in the Y direction) between the pillar regions 111, which are spaced apart from each other, may be greater than the distance (the distance in the Y direction) between the well regions 110 which are spaced apart from each other. To this end, in the vertical part 107*b* of the drift region 107, a region between the well regions 110 may have a width (length in the Y direction) less than a region between the pillar regions 111.

According to an embodiment, a plurality of pillar regions 111 and a plurality of drift regions 107 may be alternately disposed such that a lateral side of each pillar region makes contact with a lateral side of each drift region 107, thereby forming a super junction structure. Furthermore, the plurality of pillar regions 111 and the plurality of drift regions 107 may be alternately disposed under one well region 110.

Source regions 112 may be formed inside the well region 110 and may be formed in the first conductive type. For example, each of the source regions 112 may be formed between the recess gate electrodes 120R inside the well region 110, and may be formed, as the first conductive type of impurities are implanted into a partial region of the well region 110. The source regions 112 may be formed, as the first conductive type of impurities are implanted at a higher concentration than the concentration of the drift region 107.

Each of the channel regions 110*a* may be formed between the vertical part 107*b* of the drift region 107 and each of the source regions 112. The channel regions 110*a* may include the second conductive type of impurities. Since the channel regions 110*a* include impurities in the second conductive type opposite to the conductive type of the source regions 112 and the drift region 107, the channel regions 110*a* may form a diode junction together with the source regions 112 and the drift region 107. Accordingly, since the channel regions 110*a* do not allow the movement of charges when the power semiconductor device 100 does not operate, the channel regions 110*a* may electrically isolate the vertical part 107*b* of the drift region 107 from the source regions 112. To the contrary, when an operating voltage is applied to the gate electrode layer 120, the channel regions 110*a* allow charges to move, as an inversion channel is formed inside the channel regions 110*a*. Accordingly, the channel regions 110*a* may electrically connect the vertical part 107*b* of the drift region 107 to the source regions 112.

Although FIG. 1 illustrates that the channel regions 110*a* are displayed to be distinguished from the well region 110, the channel regions 110*a* may be some of the well region 110. For example, the channel regions 110*a* may correspond to a region, which is interposed between the vertical part 107*b* of the drift region 107 and the source region 112, of the well region 110. The second conductive type of impurities of the channel regions 110*a* may have a doping concentration equal to the doping concentration of the second conductive type of impurities of the well region 110, or different from the doping concentration of the second conductive type of impurities of the well region 110 to adjust a threshold voltage.

According to an embodiment, the well region 110, the pillar region 111, the channel regions 110*a*, and the source regions 112 may be formed to be symmetric to each other about the vertical part 107*b* of the drift region 107 in the Y direction. For example, each of the well region 110, the pillar region 111, the channel regions 110*a*, and the source regions 112 may include first parts and second parts positioned at opposite sides of the vertical part 107*b* of the drift region 107 in the Y direction. The well region 110, the pillar region 111, and the source regions 112 may be separated from each other by the vertical part 107*b* of the drift region 107, or may be connected to each other to surround the vertical part 107*b* of the drift region 107.

Additionally, a drain region 102 may be formed in the semiconductor layer 105 under the drift region 107 and may include the first conductive type of impurities. For example, the drain region 102 may include the first conductive type of impurities implanted at a concentration higher than the concentration of the first conductive type of impurities of the drift region 107.

According to an embodiment, the drain region 102 may be provided as an SiC-substrate in the first conductive type. In this case, the drain region 102 may be formed as a portion of the semiconductor layer 105 or a substrate separate from the semiconductor layer 105.

At least one trench 116 may be formed, as the semiconductor layer 105 is etched by a specific depth from the surface (the top surface) of the semiconductor layer 105 into the semiconductor layer 105. At least one trench 116 may include a plurality of trenches spaced apart from each other by a specific distance in the X direction. The trenches 116 may extend in parallel to the Y direction to pass through the vertical part 107*b* of the drift region 107 and the channel regions 110*a* inside the semiconductor layer 105.

Each of the channel regions 110*a* may be interposed between the trenches 116, and a region, which makes contact with the well region 110, of the vertical part 107*b* of the drift region 107 may be divided into a plurality of regions by the trenches 116. According to an embodiment, the vertical part 107*b* of the drift region 107 may be interposed in the form of a partition between the trenches 116. The channel regions 110*a* may be interposed at opposite sides (opposite sides in the Y direction) of the vertical part 107*b* provided in the form of the partition. In addition, the source regions 112 may be positioned at opposite sides of the channel regions 110*a* in the Y direction.

The gate insulating layer 118 may be formed on at least inner surfaces of the trenches 116. For example, the gate insulating layer 118 may be formed on the inner surfaces of the trenches 116 and on the semiconductor layer 105 outside the trenches 116. A thickness of the gate insulating layer 118 may be uniform, or a part of the gate insulating layer 118 formed on the bottom surface of the trench 116 may be thicker than a part of the gate insulating layer 118 formed on a side wall of the trench 116, such that an electric field is reduced at a bottom part of the trench 116.

The gate insulating layer 118 may include an insulating material, such as a silicon oxide, an SiC oxide, a silicon nitride, a hafnium oxide, a zirconium oxide, or an aluminum oxide, or a stacked structure thereof.

The gate electrode layer 120 may be formed on the gate insulating layer 118 to fill the trench 116. In addition, the gate electrode layer 120 may be formed on the gate insulating layer 118 on the semiconductor layer 105 to cover at least the channel region 110*a*. For example, the gate electrode layer 120 may include a plurality of recess gate electrodes 120R spaced apart from each other by a specific distance in an X direction and formed to be buried in the trench 116. In addition, the gate electrode layer 120 may include a plate gate electrode 120P provided in a flat plate form to connect the plurality of recess gate electrodes 120R to each other while covering the channel regions 110*a*

According to the present embodiment, the power semiconductor device 100 may have the structure, in which the source region 112, the channel region 110*a*, and the vertical part 107*b* are connected to each other in the Y direction, interposed between the plurality of recess gate electrodes 120R provided under the plate gate electrode 120P. For example, the channel region 110*a* and the source region 112 may be formed on opposite sidewalls of the vertical part 107*b*, which extends in the Y direction, to be connected to each other, between the plurality of recess gate electrodes 120R. The vertical part 107*b* of the drift region 107, the channel region 110*a*, and the source region 112, which are connected to each other, may serve as a moving path of the current, when the power semiconductor device 100 operates.

As described above, according to the present embodiment, the power semiconductor device 100 includes a multilateral channel structure having the moving path of the current, in which the vertical part 107*b* of the drift region 107, the channel region 110*a*, and the source region 112 are connected to each other, formed between the plurality of recess gate electrodes 120R, such that more charges simultaneously move. In addition, on the moving path, the gate electrode layer 120 is formed to surround three surfaces (opposite surfaces in the X direction, and the top surface) of the vertical part 107*b*, the channel region 110*a*, and the source region 112, such that more charges simultaneously move. The gate electrode layer 120 may include a conductive material, such as polysilicon, metal, a metal nitride, or a metal silicide, or may include a stack structure thereof.

The well region 110 may be formed at a depth deeper than the depths of the recess gate electrodes 120R to surround the lateral sides and the bottom surface of the recess gate electrodes 120R.

The interlayer insulating layer 130 may be formed on the gate electrode layer 120. The interlayer insulating layer 130 may include an insulating material, such as an oxide layer, a nitride layer, or the stack structure thereof, for electrical insulation between the gate electrode layer 120 and the source electrode layer 140.

The source electrode layer 140 may be formed on the interlayer insulating layer 130 and may be electrically connected with the source regions 112. The source electrode layer 140 may include a conductive material such as metal.

Although the above description has been made in that the first conductive type and the second conductive type are an N type and a P type, according to an embodiment, the first conductive type and the second conductive type may be the P type and the N type. In more detail, when the power semiconductor device 100 is an N-type MOSFET, the drift region 107 may be an N− region, the source region 112 and the drain region 102 may be N+ regions, and the well region 110, the pillar region 111, and the channel region 110*a* may be P− regions.

When the power semiconductor device 100 operates, the current may flow in a vertical direction along the vertical parts 107*b* of the drift region 107 from the drain region 102, and then may flow to the source region 112 through the channel region 110*a*.

In the power semiconductor device 100 described above, the recess gate electrodes 120R in the trenches 116 may be densely arranged in parallel in a stripe type or a line type, and the channel regions 110*a* may be interposed between the recess gate electrodes 120R, thereby increasing the channel density.

In addition, in the power semiconductor device 100 according to the present embodiment, the well region 110 may be formed to surround the lower portion of the trench 116, thereby mitigating the concentration of the electric field to the lower corner part of the gate electrode layer 120. Furthermore, according to the present embodiment, the power semiconductor device 100 may include insulating-layer protective regions 115 to surround a lower portion of each of the recess gate electrodes 120R in the vertical part 107*b* of the drift region 107. The insulating-layer protective regions 115 may include the second conductive type of impurities.

When the operating voltage is applied to the gate electrode layer 120, the electric field may be concentrated to the lower corner parts of the recess gate electrodes 120R. When the electric field is concentrated, the gate insulating layer 118 in the relevant region may receive stress, so dielectric breakdown of the gate insulating layer 118 may be caused. Therefore, according to the present embodiment, lower portions, which are formed in the well region 110, of the recess gate electrodes 120R may be surrounded by the well region 110 in the P type, and lower portions, which are formed in the vertical part 107*b* of the drift region 107, of the recess gate electrodes 120R may be surrounded by the insulating-layer protective regions 115 in the P type, thereby preventing the dielectric breakdown of the gate insulating layer 118, as the electric field is concentrated to the corner parts of the gate insulating layer 118.

According to the present embodiment, in the power semiconductor device 100, since the current flows through the vertical parts 107*b* of the drift region 107, when the insulating-layer protective region 115 is formed, the moving path of the current is reduced to increase a resistance (JFET resistance). However, in the power semiconductor device 100 according to the present embodiment, the JFET resistance may be reduced by using the pillar region 111 forming the super junction together with the drift region 107. For example, according to the present embodiment, as illustrated in FIG. 6 described below, a charge amount in the pillar region 111 and a charge amount in the drift region 107 are adjusted to reduce the JFET resistance.

Figure 6:
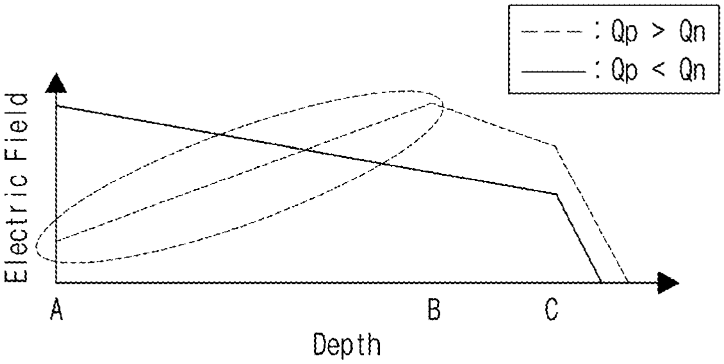
FIG. 6 is a graph illustrating the variation in electric field depending on the depth of a power semiconductor device.

FIG. 6 is a graph illustrating the change in an electric field depending on the depth of a power semiconductor device.

Referring to FIG. 6, when a charge amount Qp of the pillar region 111 is greater than a charge amount Qn of the drift region 107, and when the power semiconductor device 100 operates, a breakdown voltage may be increased by allowing the maximum electric field to be formed in the drift region 107 on the same line as the bottom surface of the pillar region 111. As illustrated in FIG. 6, the gradient of the intensity of the electric field between the position ‘A’ and position ‘B’ may be controlled by adjusting the charge amount Qp of the pillar region 111.

For example, the charge amount Qp of the pillar region 111 may become greater than the charge amount Qn of the drift region 107 by making a doping concentration of the second conductive type of impurities of the pillar region 111 higher than a doping concentration of the first conductive type of impurities of the drift region 107, thereby enhancing the withstand voltage characteristic of the power semiconductor device 100, such that the JFET resistance is reduced.

Figure 7:
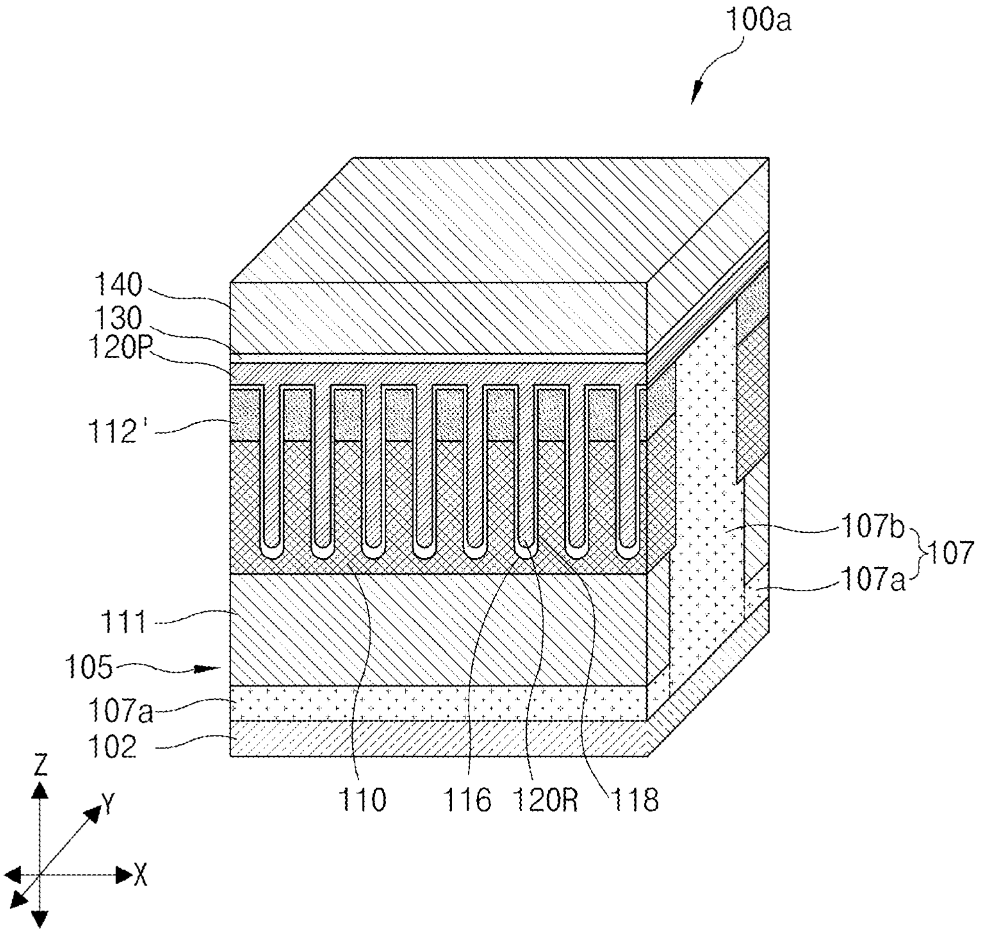
FIG. 7 is a schematic perspective view illustrating the structure of a power semiconductor device, according to another embodiment of the present disclosure.

FIG. 7 is a perspective view schematically illustrating the structure of a power semiconductor device, according to another embodiment of the present disclosure.

A power semiconductor device 100*a* according to the present embodiment is formed by partially modifying the structure of the power semiconductor device 100 as illustrated in FIGS. 1 to 5. Accordingly, the duplicated description of the structure will be omitted to avoid redundancy.

Referring to FIG. 7, according to the present embodiment, the power semiconductor device 100*a* may have source regions 112' formed to make contact with the vertical parts 107*b* of the drift region 107. The source regions 112' may include the first conductive type of impurities the same as those of the source regions 112.

In the structure of the SiC semiconductor layer 105, a potential barrier is formed on the moving path of the current due to negative charges, which are generated, as a carbon cluster is formed on the gate insulating layer 118, thereby blocking the current from moving. Accordingly, as in the present embodiment, even if the source regions 112' are formed to make contact with the vertical parts 107*b* of the drift region 107, when the operating voltage is applied to the gate electrode layer 120, an accumulation channel may be formed to allow the flow of the current. In this case, the operating voltage may be remarkably lower than an operating voltage for forming an inversion channel in the channel region 110*a* of FIG. 1.

Figure 8:
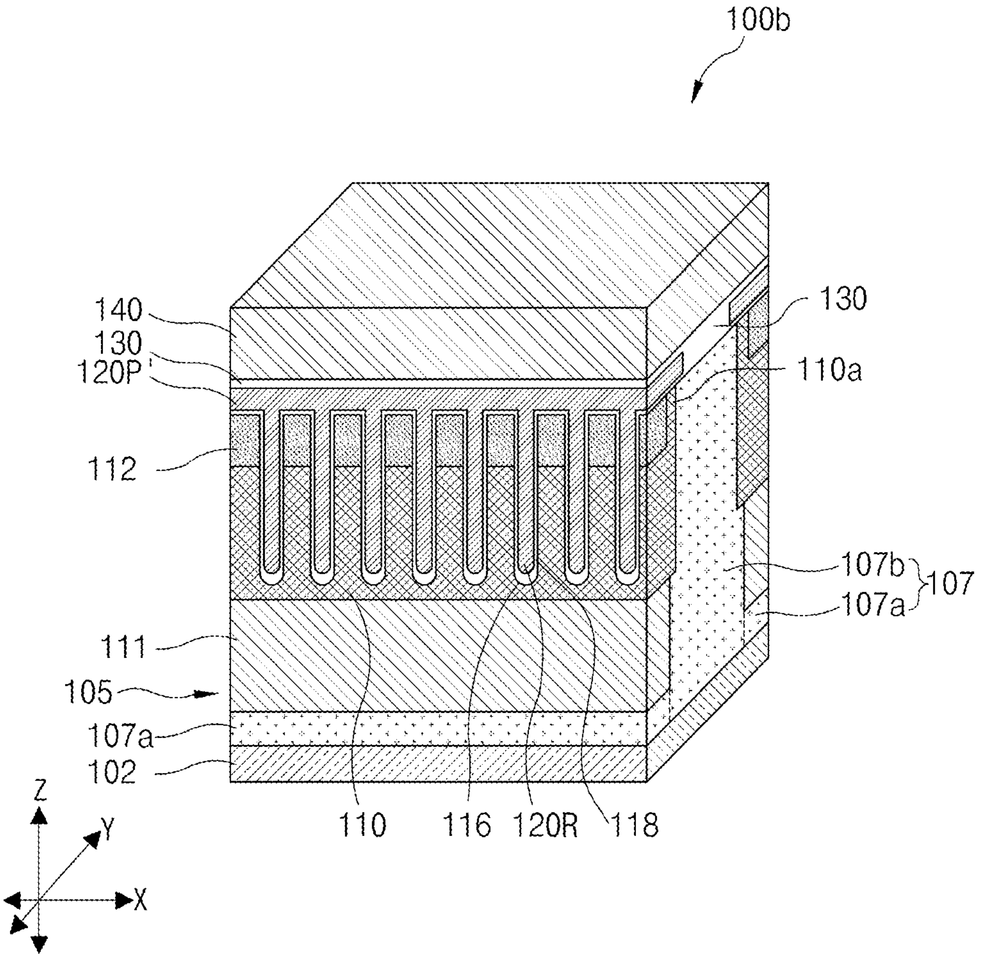
FIG. 8 is a schematic perspective view illustrating the structure of a power semiconductor device, according to another embodiment of the present disclosure.
Figure 9:
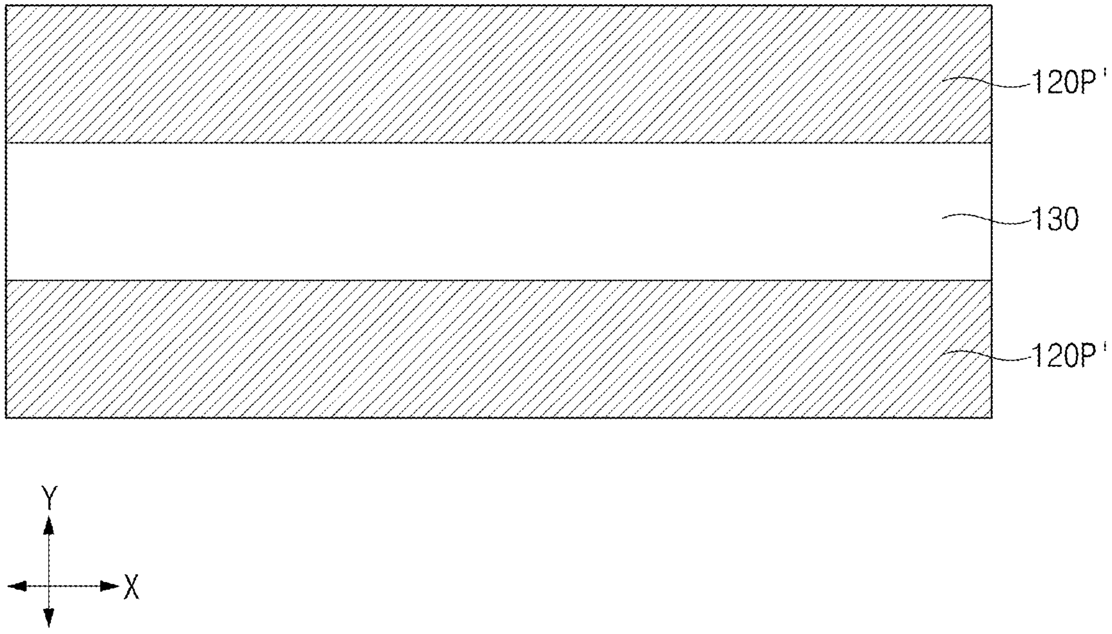
FIG. 9 is a cross-sectional view illustrating the structure of a plate gate of FIG. 8.

FIG. 8 is a schematic perspective view illustrating the structure of a power semiconductor device, according to another embodiment of the present disclosure, and FIG. 9 is a cross-sectional view illustrating the structure of a plate gate of FIG. 8.

A power semiconductor device 100*b* according to the present embodiment is formed by partially modifying the structure of the power semiconductor device 100 as illustrated in FIGS. 1 to 5. Accordingly, the duplicated description of the structure will be omitted to avoid redundancy.

Referring to FIGS. 8 and 9, in the power semiconductor device 100*b* according to the present embodiment, a plate gate 120P' may be formed in a separate form as illustrated in FIG. 9, instead of one integral flat plate form.

For example, the plate gate electrode (or plate gate) 120P as illustrated in FIG. 1 or FIG. 7 described above is provided in one flat plate form to cover the entire portion of the vertical part 107*b* and the channel regions 110*a* and the source regions 112 provided at opposite sides of the vertical part 107*b*. However, according to the present embodiment, the plate gate 120P' may be provided in a form having no gate electrode layer on the vertical part 107*b*. In other words, the gate electrode layer 120 has a form, in which the recess gates 120R are present only on opposite side walls (opposite side walls in the X direction) of the vertical part 107*b*, regarding the vertical part 107*b*, and may have a form in which the recess gate 120R and the plate gate 120P' surround three surfaces of the channel regions 110*a* and the source regions 112 in an inverse U shape, regarding the channel regions 110*a* and the source regions 112.

As described above, according to the present embodiment, as an electrode material (a gate electrode layer) is not formed on the vertical part 107*b*, a parasitic capacitance resulting from the electrode material may be reduced.

Figure 10:
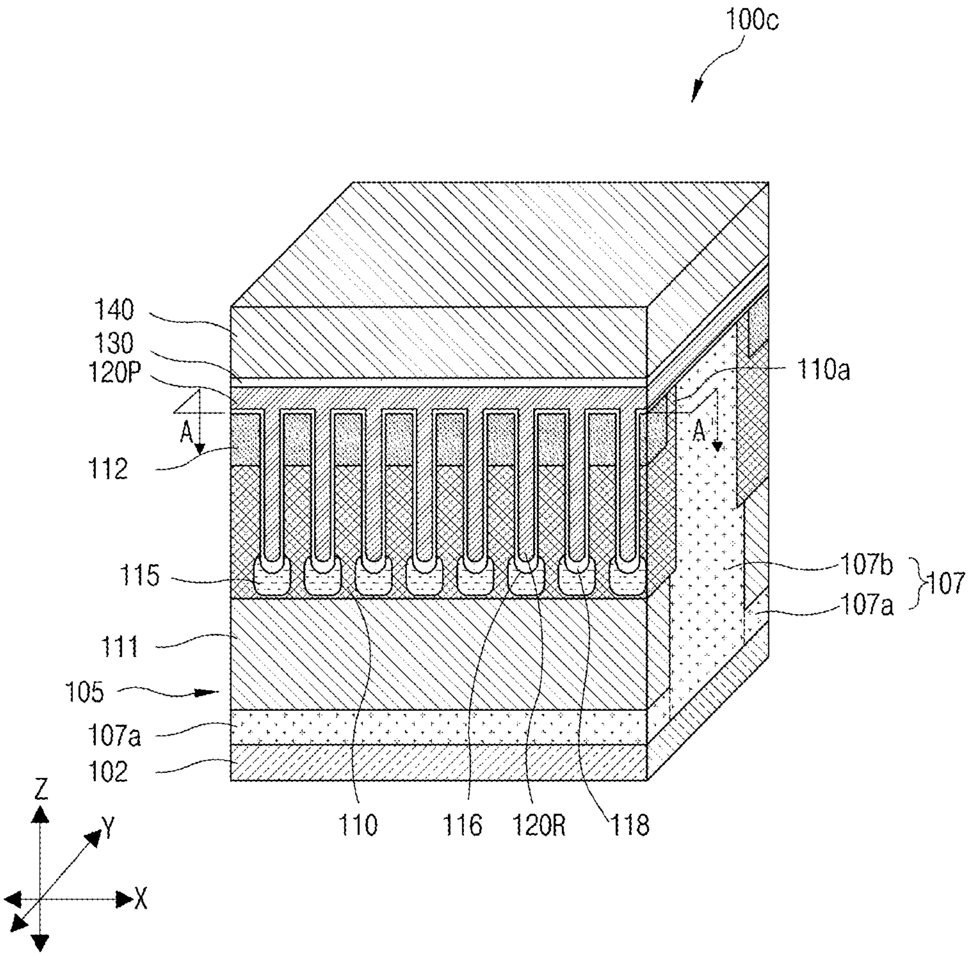
FIG. 10 is a schematic perspective view illustrating the structure of a power semiconductor device, according to another embodiment of the present disclosure.

FIG. 10 is a schematic perspective view illustrating the structure of a power semiconductor device, according to another embodiment of the present disclosure.

Referring to FIG. 10, a power semiconductor device 100*c* may have an insulating-layer protective region 115 formed to extend to the well region 110. When compared with the power semiconductor device 100 illustrated in FIG. 1, the power semiconductor device 100*c* may have the same components as those of the power semiconductor device 100 of FIG. 1, except that the insulating-layer protective region 115 further extends to the well region 110 in the Y direction.

Although FIG. 10 illustrates that the insulating-layer protective regions 115 are divided into each other in the well region 110, the well region 110 and the insulating-layer protective regions 115 include the same conductive type of impurities. Accordingly, when the well region 110 and the insulating-layer protective regions 115 are formed at the substantially same concentration, the insulating-layer protective regions 115 are not divided into each other in the well region 110, which is similar to the power semiconductor device 100 as in FIG. 1.

Figure 11:
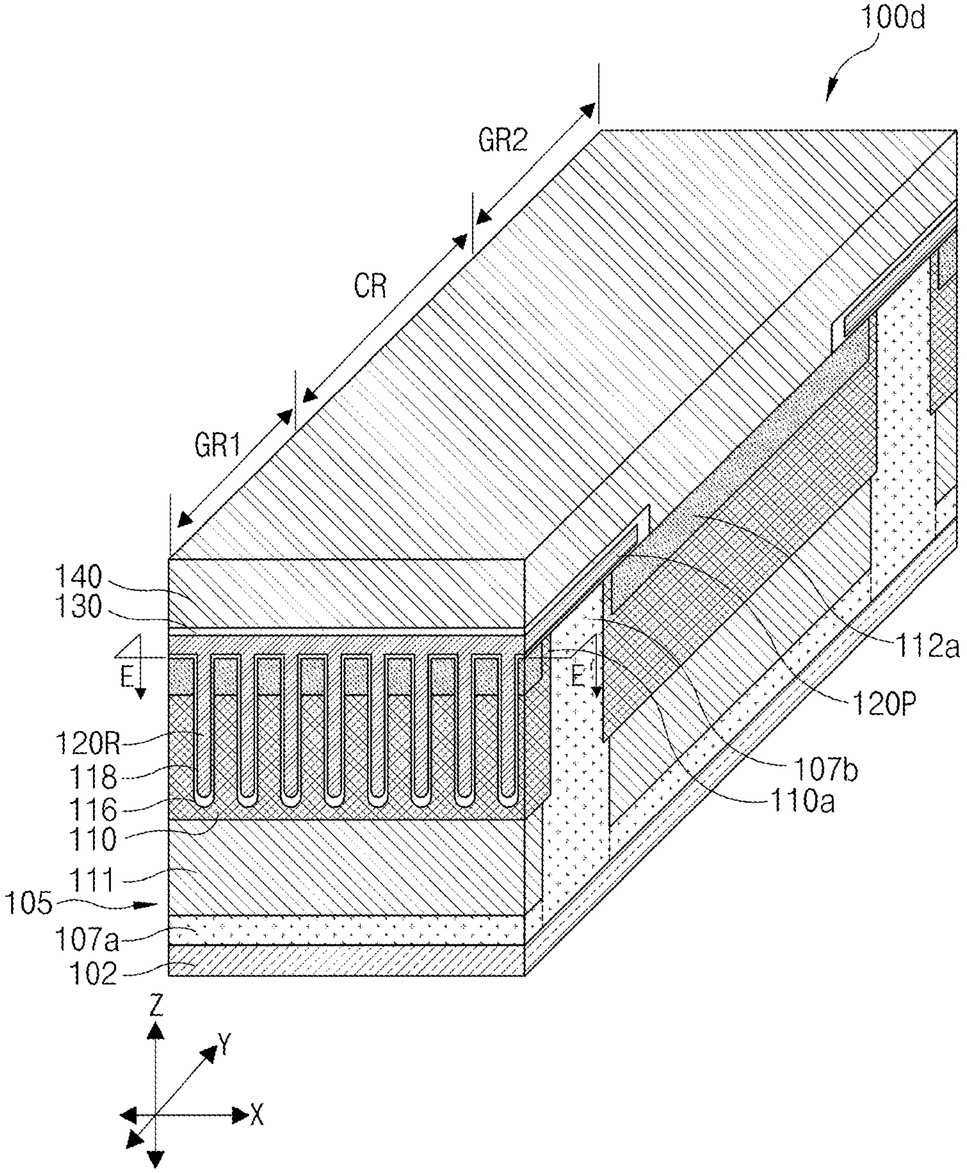
FIG. 11 is a schematic perspective view illustrating the structure of a power semiconductor device, according to another embodiment of the present disclosure.
Figure 12:
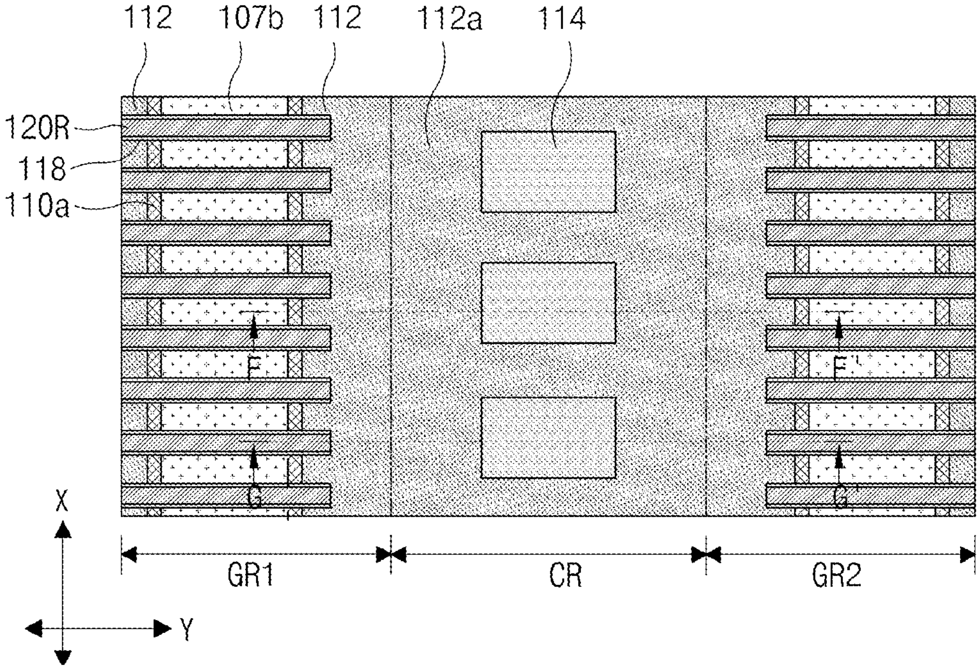
FIG. 12 is a cross-sectional view illustrating the structure taken along line E-E' of FIG. 11.
Figure 13:
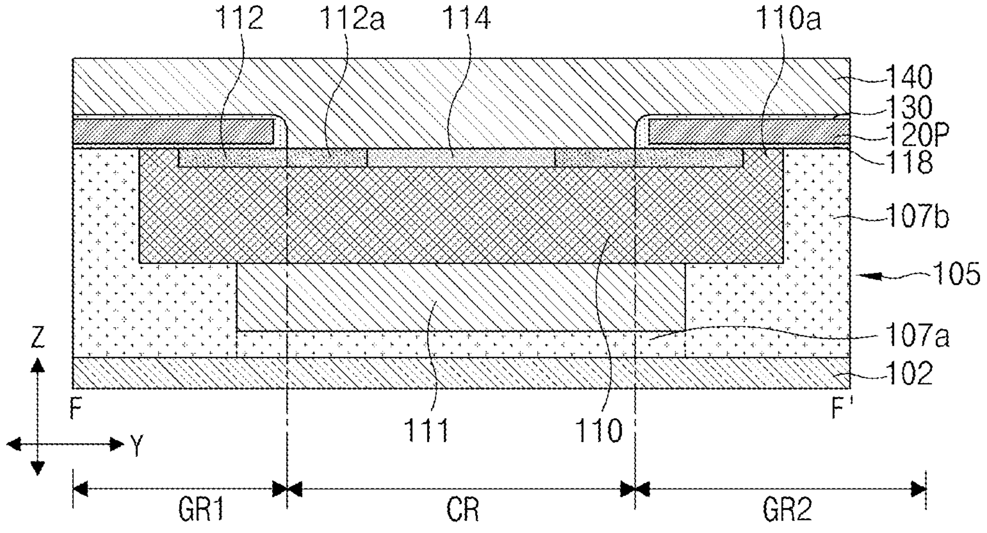
FIG. 13 is a longitudinal-sectional view illustrating the structure taken along line F-F' of FIG. 12.
Figure 14:
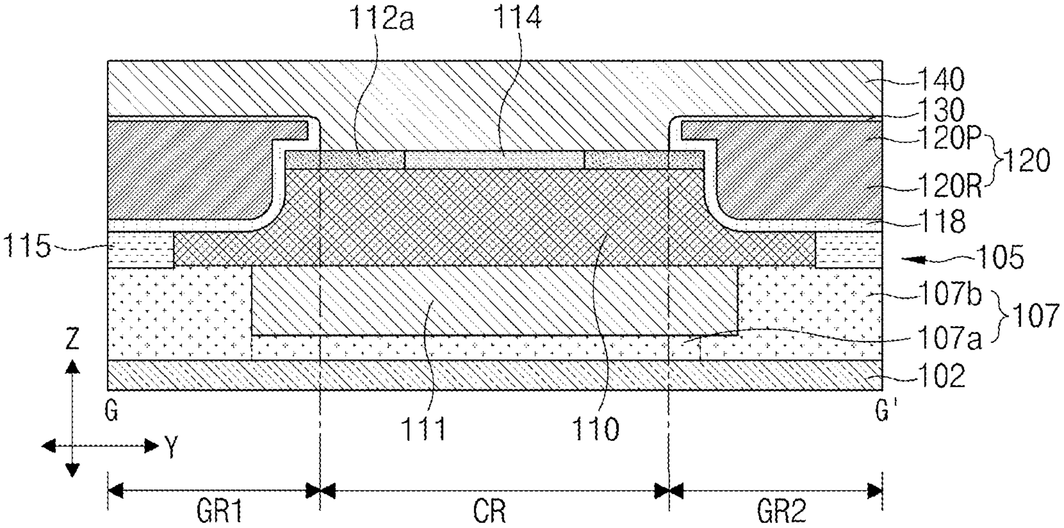
FIG. 14 is a longitudinal-sectional view illustrating the structure taken along line G-G' of FIG. 12.

FIG. 11 is a schematic perspective view illustrating the structure of a power semiconductor device, according to another embodiment of the present disclosure, and FIG. 12 is a cross-sectional view illustrating the structure taken along line E-E' of FIG. 11. FIGS. 13 to 14 are longitudinal sectional views illustrating the structure taken along lines F-F' and G-G' of FIG. 12.

According to the present embodiment, a power semiconductor device 100*d* is formed by employing or partially modifying the power semiconductor device 100 of FIG. 1. Accordingly, the duplicated description will be omitted to avoid redundancy.

Referring to FIGS. 11 to 14, the power semiconductor device 100*d* may include at least one gate region GR1 or GR2 and a contact region CR.

The gate regions GR1 and GR2, which include the gate electrode layer 120, may include the structure as illustrated in FIG. 1, FIG. 7, FIG. 8 or FIG. 10, as described above. FIG. 11 illustrates an embodiment in which the gate regions GR1 and GR2 include the structure as illustrated in FIG. 1. Accordingly, the details of the gate regions GR1 and GR2 will be omitted.

The contact region CR, which is to connect source regions 112 of the gate regions GR1 and GR2 to the source electrode layer 140, may be positioned at one side of each of the gate regions GR1 and GR2. The contact region CR may include a drift region 107*a*, the well region 110, the pillar region 111, a source contact region 112*a*, a well contact region 114, and the source electrode layer 140.

The drift region 107*a*, the well region 110 and the pillar region 111 of the contact region CR may be integrally formed with the drift region 107*a*, the well region 110 and the pillar region 111 of the gate regions GR1 and GR2, respectively. In other words, the drift regions 107*a* of the gate regions GR1 and GR2 are integrally formed with the drift region 107*a* of the contact region CR, the well regions 110 of the gate regions GR1 and GR2 are integrally formed with the well region 110 of the contact region CR, and the pillar regions 111 of the gate regions GR1 and GR2 are integrally formed with the pillar region 111 of the contact region CR.

The source contact regions 112*a* are to connect the source regions 112 to the source electrode layer 140. The source contact region 112*a* may be positioned between the gate regions GR1 and GR2 in the Y direction, and may be integrally formed with the source regions 112. For example, the source regions 112 may extend to the contact region CR. The extending source regions 112 may be commonly and integrally connected to outer portions of the recess gate electrodes 120R. In this case, parts, which are commonly and integrally connected to the outer portions of the recess gate electrodes 120R, may be the source contact regions 112*a*. Accordingly, the source contact region 112*a* may be a portion of the source regions 112. The source regions 112 may be electrically connected to the source electrode layer 140 through the source contact region 112*a*.

The well contact region 114 may be formed in the source contact region 112*a*. For example, the well contact region 114 may extend from the well region 110 to pass through the source contact region 112*a*. At least one well contact region 114 may be formed in the source contact region 112*a*.

The well contact region 114 may include the second conductive type of impurities. For example, the well contact region 114 may be doped with the second conductive type of impurities at a higher concentration than the concentration of the well region 110 to reduce a contact resistance when connected to the source electrode layer 140. The well contact region 114 may be a P+ region.

The source electrode layer 140 of the contact region CR may be formed to be integrally connected to the source electrode layer 140 of the gate regions GR1 and GR2. The source electrode layer 140 may be commonly connected to the source contact region 112*a* and the well contact region 114.

The plate gate electrode 120P of the gate regions GR1 and GR2 may be formed to extend to boundary regions between the contact region CR, and the gate regions GR1 and GR2 in the Y direction. For example, as illustrated in FIG. 13, the plate gate electrode 120P may more longitudinally extend in the Y direction, such that the plate gate electrode 120P is closer to the contact region CR, as compared to the recess gate electrodes 120R. The recess gate electrodes 120R may be formed to extend to a partial region of the well region 110 while passing through the vertical part 107*b* of the drift region 107 in the Y direction.

The source regions 112 formed between the recess gate electrodes 120R may be commonly connected to the source contact region 112*a*. The insulating-layer protective regions 115 may be formed at the vertical part 107*b* of the drift region 107 to surround the lower portion of each of the recess gate electrodes 120R.

Although FIGS. 11 to 14 illustrate that the source contact region 112*a* and the well contact region 114 are formed only at one side of each of the vertical part 107*b* of the drift region 107, when the source region 112 and the well region 110 are divided into a plurality of regions, the source contact region 112*a* and the well contact region 114 may be formed in each divided region. For example, when the source regions 112 and the well regions 110 provided at opposite sides of the vertical part 107*b* are electrically connected to each other, the contact region CR may be formed only at one side of the vertical part 107*b* as illustrated in FIG. 11. To the contrary, when the source regions 112 and the well regions 110 provided at opposite sides of the vertical part 107*b* are electrically isolated from each other, the contact regions CR may be formed at opposite sides of the vertical part 107*b*.

As the power semiconductor device 100*d* in FIG. 11 may include two gate regions GR1 and GR2 and one contact region CR formed between the gate regions GR1 and GR2, one contact region CR is commonly connected to the two gate regions GR1 and GR2. However, the power semiconductor device 100*d* may include one gate region GR1 or GR2 and one contact region CR formed at one side of the gate region GR1 or GR2. In this case, the contact region CR may be formed at one side of the gate region GR1 or GR2 in the Y direction or the X direction.

In addition, the power semiconductor device 100*d* may include a plurality of gate regions and a plurality of contact regions interposed between the gate regions. For example, the power semiconductor device 100*d* may include at least three gate regions arranged to be spaced apart from each other by a specific distance in the Y direction, and a plurality of contact regions, each of which is interposed between adjacent gate regions. In this case, the structure of which the adjacent gate regions and the contact region interposed between the adjacent gate regions may be the same as the structure in FIG. 11 to FIG. 14.

FIGS. 15 to 19 are perspective views schematically illustrating a method for manufacturing the power semiconductor device of FIG. 1.

Figure 15:
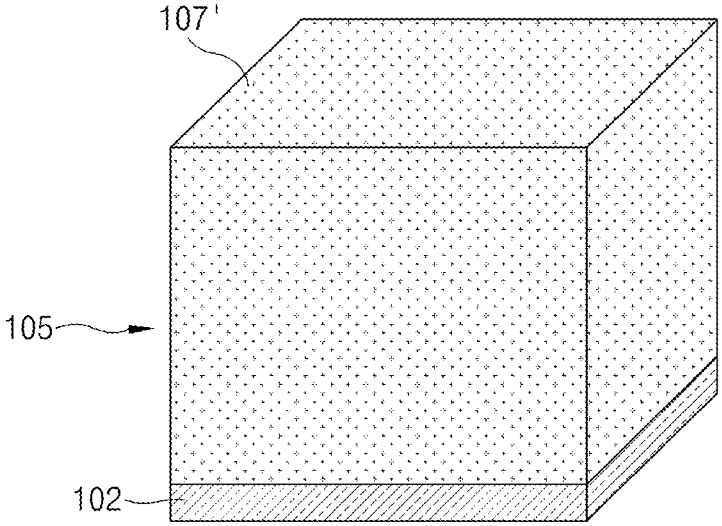
FIGS. 15 to 19 are perspective views schematically illustrating a method for fabricating a power semiconductor device of FIG. 1.

Referring to FIG. 15, a drift region 107' having the first conductive type may be formed in the SiC semiconductor layer 105. For example, the drift region 107' may be formed on the drain region 102 having the first conductive type. According to an embodiment, the drain region 102 may be provided in the form of a substrate in the first conductive type, and the drift region 107' may be formed in the form of one or more epitaxial layers, on the substrate. The first conductive type may be an N type.

Figure 16:
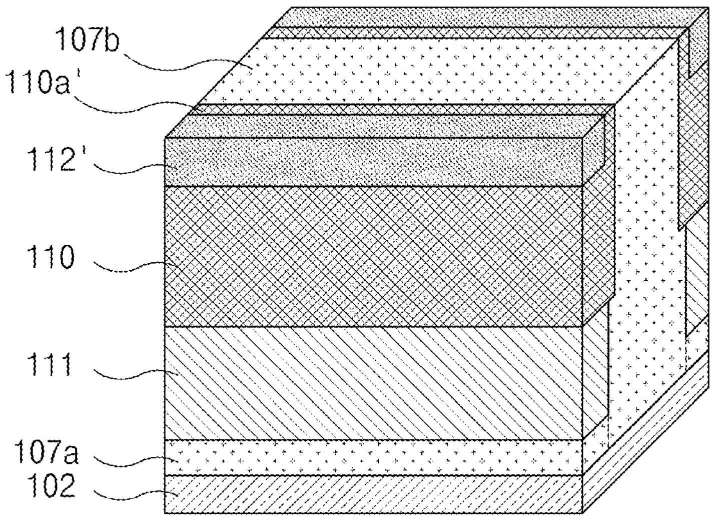

Next, referring to FIG. 16, the well region 110 and the pillar region 111 may be formed by implanting the second conductive type of impurities into the drift region 107'. For example, after forming a mask pattern (a photoresist pattern) on the drift region 107' to open a region for the well region 110, the second conductive type of impurities are implanted into the drift region 107' by a specific depth, thereby forming the vertical part 107*b* and the well region 110.

The well region 110 may be formed at least at one side of the vertical part 107*b*. For example, the well region 110 may be formed at opposite sides of the vertical part 107*b* in the Y direction, or may be formed to surround the vertical part 107*b*.

Thereafter, the pillar region 111 may be formed by implanting the second conductive type of impurities into the drift region 107' under the well region 110. For example, after removing the mask pattern used when forming the well region 110, and forming a mask pattern, which is for defining the pillar region 111, on the drift region 107', the second conductive type of impurities are implanted into the lower portion of the well region 110 to form the pillar region 111. In this case, the pillar region 111 may be formed such that the drift region 107*a* having a specific thickness is present under the pillar region 111. As described above, the pillar region 111 in the second conductive type may be formed to have a bottom surface and a side surface making contact with the horizontal part 107*a* and the vertical part 107*b* of each drift region 107, thereby forming the super junction. The pillar region 111 may be formed to have the top surface making contact with the well region 110. The second conductive type may be a P type opposite to the first conductive type.

Although the above-described embodiment has been described in that the well region 110 is first formed and the pillar region 111 is formed under the well region 110, the pillar region 111 may be first formed and the well region 110 may be formed on the pillar region 111.

Thereafter, the source region 112' having the first conductive type may be formed in the well region 110. For example, the source region 112' may be formed by implanting the first conductive type of impurities into the well region 110. The source region 112' may be actually formed at a specific depth from the surface of the semiconductor layer 105, and may be formed in the form of a bar longitudinally extending in the X direction. The source region 112' may be formed to be spaced apart from the vertical part 107*b* by a specific distance. In this case, a part, which is interposed between the source region 112' and the vertical part 107*b*, in the well region 110 may be a channel region

110*a*'. Alternatively, the source region 112' may be formed to make contact with the vertical part 107*b*, as illustrated in FIG. 7.

Alternatively, after implanting the impurities, a heat treatment step of activating or spreading the impurities may be performed.

Figure 17:
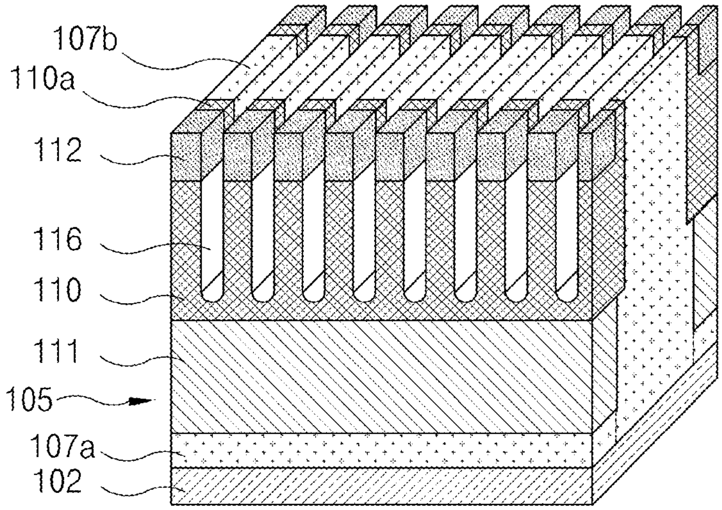

Next, referring to FIG. 17, after forming a mask pattern, which is for defining a region for the trench 116, on the semiconductor layer 105, the semiconductor layer 105 is etched to a specific depth by using the mask pattern as an etching mask, thereby forming the trenches 116 arranged to be spaced apart from each other by a specific distance in the X direction. The trenches 116 may be formed to extend in the Y direction with a length sufficient to cross the vertical part 107*b*, and the channel region 110*a*' and the source region 112' provided at opposite sides of the vertical part 107*b*.

The channel region 110*a*' and the source region 112' are divided into a plurality of regions by the trenches 116, thereby forming a plurality of channel regions 110*a* and a plurality of source regions 112. In addition, even the vertical part 107*b* may be divided into a plurality of regions by the trenches 116. The regions of the vertical part 107*b*, which are provided in the form of partitions divided by the trenches 116, and the channel region 110*a* and the source region 112 connected to each relevant vertical part 107*b* may serve as the moving path of the current. In other words, according to the present embodiment, the power semiconductor device may include a plurality of moving paths of a current, which are connected to each other in parallel, such that a larger amount of current may flow at a time.

The trenches 116 may be formed to a depth less than the depth of the well region 110, such that lower portions of the trenches 116 are surrounded by the well region 110.

Figure 19:
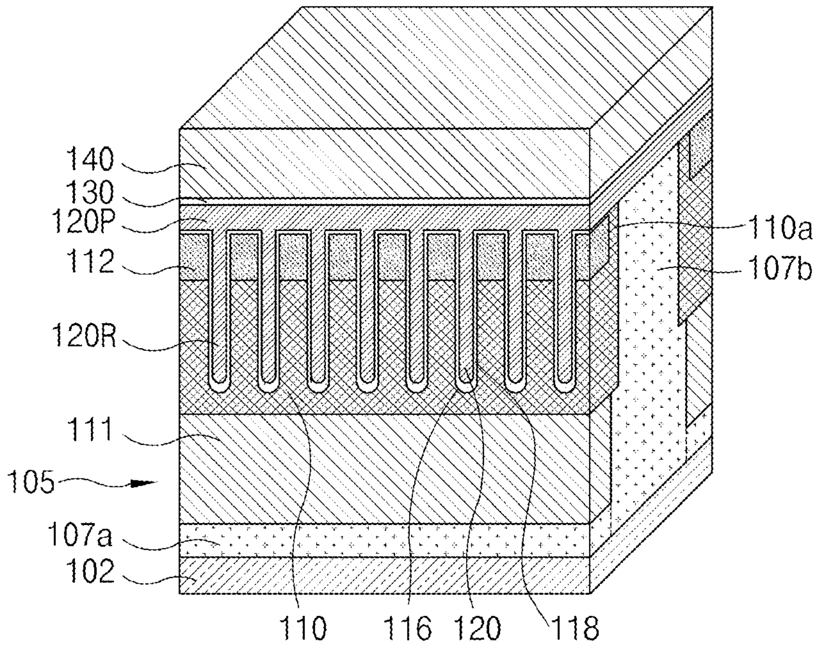

Next, referring to FIG. 19, the second conductive type (P type) of impurities are implanted into a region for the vertical part 107*b* of the drift region 107 in the trenches 116 to form the insulating-layer protective regions 115 in the vertical part 107*b*, to surround the lower portion of the trenches 116. For example, after forming the mask pattern over the semiconductor layer 105 to expose the vertical part 107*b* of the drift region 107 in the trenches 116, the P type of impurities may be implanted into the exposed region. In this case, angles for implanting ions are adjusted to form the insulating-layer protective regions (P type-impurity region) 115 implanted with the P type of impurities in the vertical part 107*b* to surround the lower portions of the trenches. The insulating-layer protective regions 115 may be formed to cross the entire portion of the vertical part 107*b* in the Y direction, and to be spaced apart from each other without being connected to each other in the X direction. When the lower portion of some of the trenches 116 is not rounded, the P-type impurity region 115 may be formed to be positioned under each trench 116 without fully surrounding the lower portion of the trench 116.

Thereafter, referring to FIG. 19, the gate insulating layers 118 may be formed on the bottom surface and the side surface of each trench 116. The gate insulating layer 118 may be formed on the semiconductor layer 105 which is an outer portion of the trench 116. The gate insulating layer 118 may be formed to include an oxide to oxidize the semiconductor layer 105 or may be formed by depositing an insulating material, such as an oxide or a nitride, on the semiconductor layer 105.

Thereafter, the gate electrode layers 120R and 120P may be formed on the gate insulating layer 118 such that the trenches 116 are buried. For example, the gate electrode layers 120R and 120P may include the recess gate electrodes 120R, which are formed to be buried in the trenches 116, and the plate gate electrode 120P provided in a flat plate form to connect the plurality of recess gate electrodes 120R to each other while covering the channel regions 110*a*. Accordingly, the plate gate electrode 120P and the recess gate electrode 120R may form a structure in the form of "n" to surround three surfaces (the top surface and opposite side surfaces) of the vertical parts 107*b* of the drift region 107, the source regions 112, and the channel regions 110*a*. The gate electrode layer 120 may be formed by implanting impurities into polysilicon or may be formed to include conductive metal or a metal silicide.

The lower portions of the recess gate electrodes 120R may be formed to be surrounded by the well region 110 and the insulating-layer protective region 115 in the second conductive type, thereby preventing the dielectric breakdown of the gate insulating layer 118, which is formed, as the electric field is concentrated to the corner part of the gate insulating layer 118.

Thereafter, the interlayer insulating layer 130 may be formed on the plate gate electrode 120P, and the source electrode layer 140 may be formed on the interlayer insulating layer 130. For example, the source electrode layer 140 may include a conductive layer, for example, a metal layer.

Figure 20:
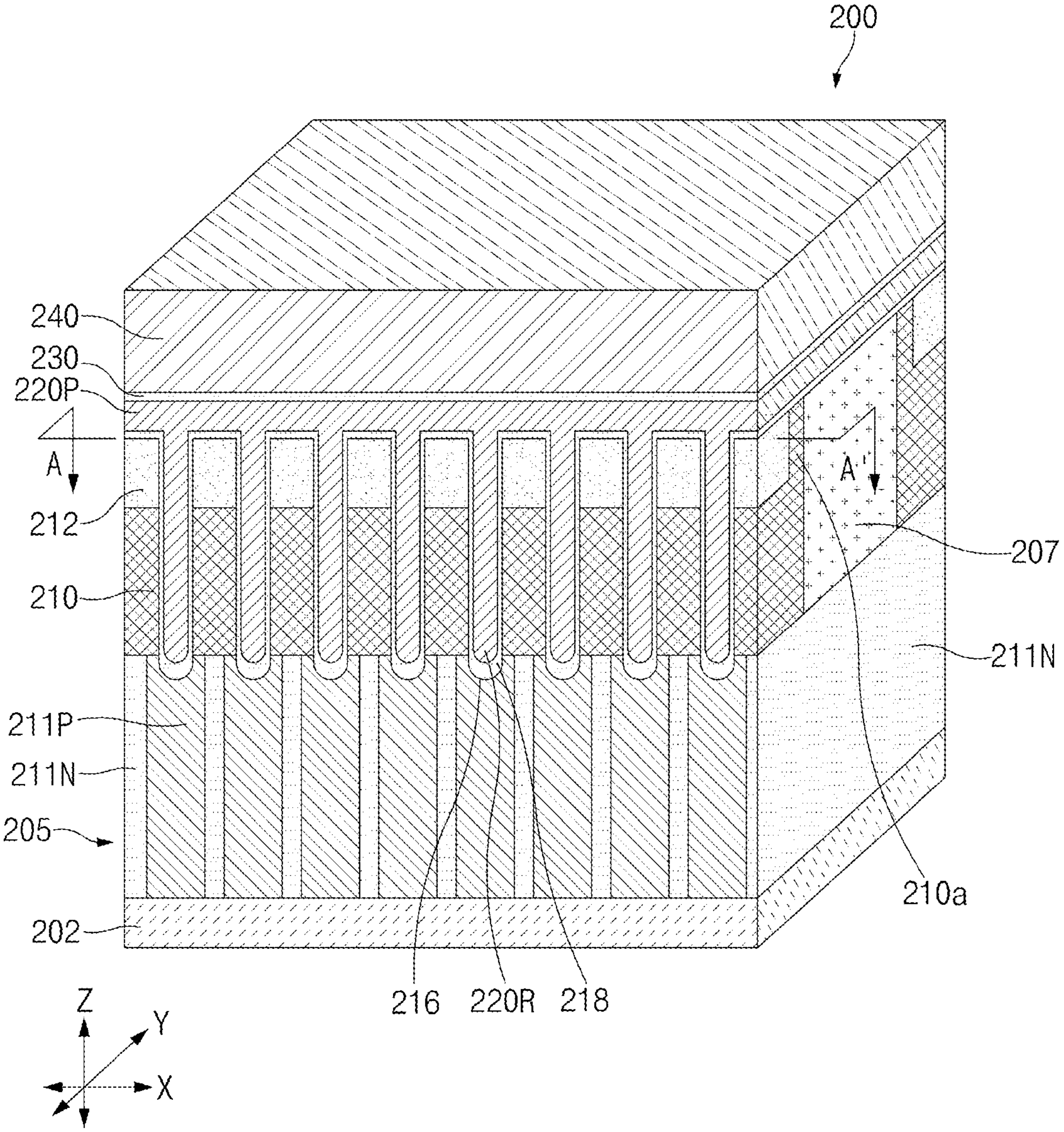
FIG. 20 is a schematic perspective view illustrating the structure of a power semiconductor device, according to another embodiment of the present disclosure.
Figure 21:
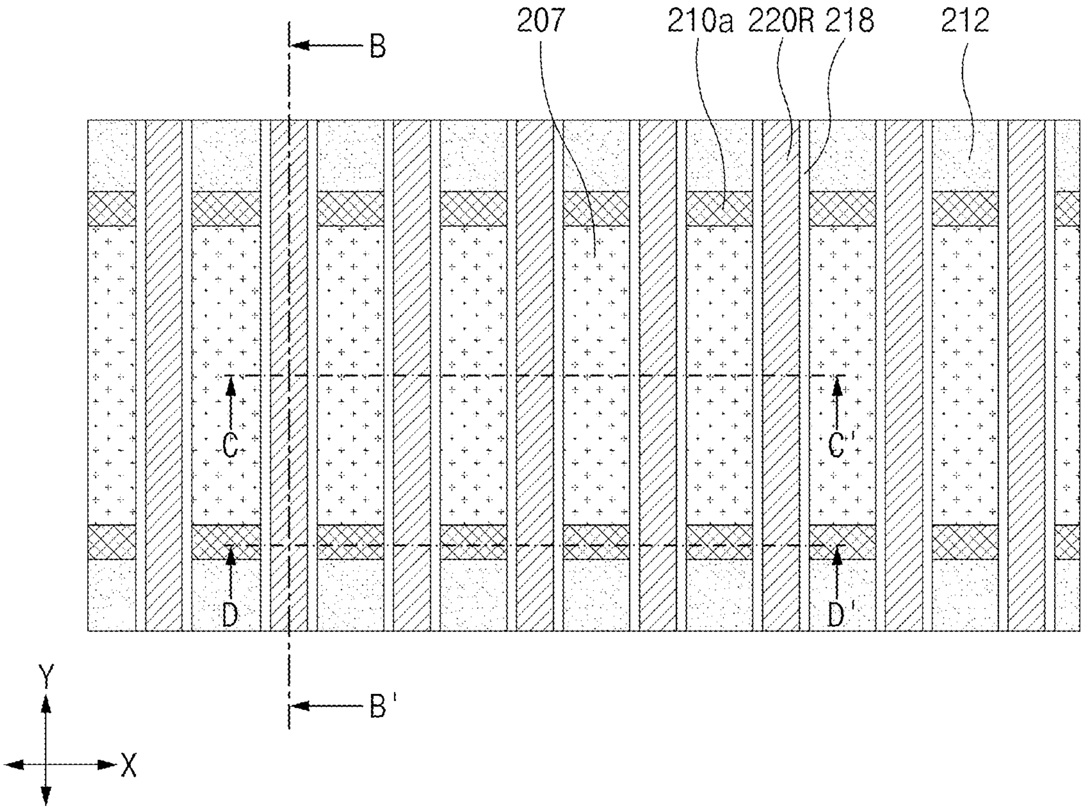
FIG. 21 is a cross-sectional view illustrating the structure taken along line A-A' of FIG. 20.
Figure 22:
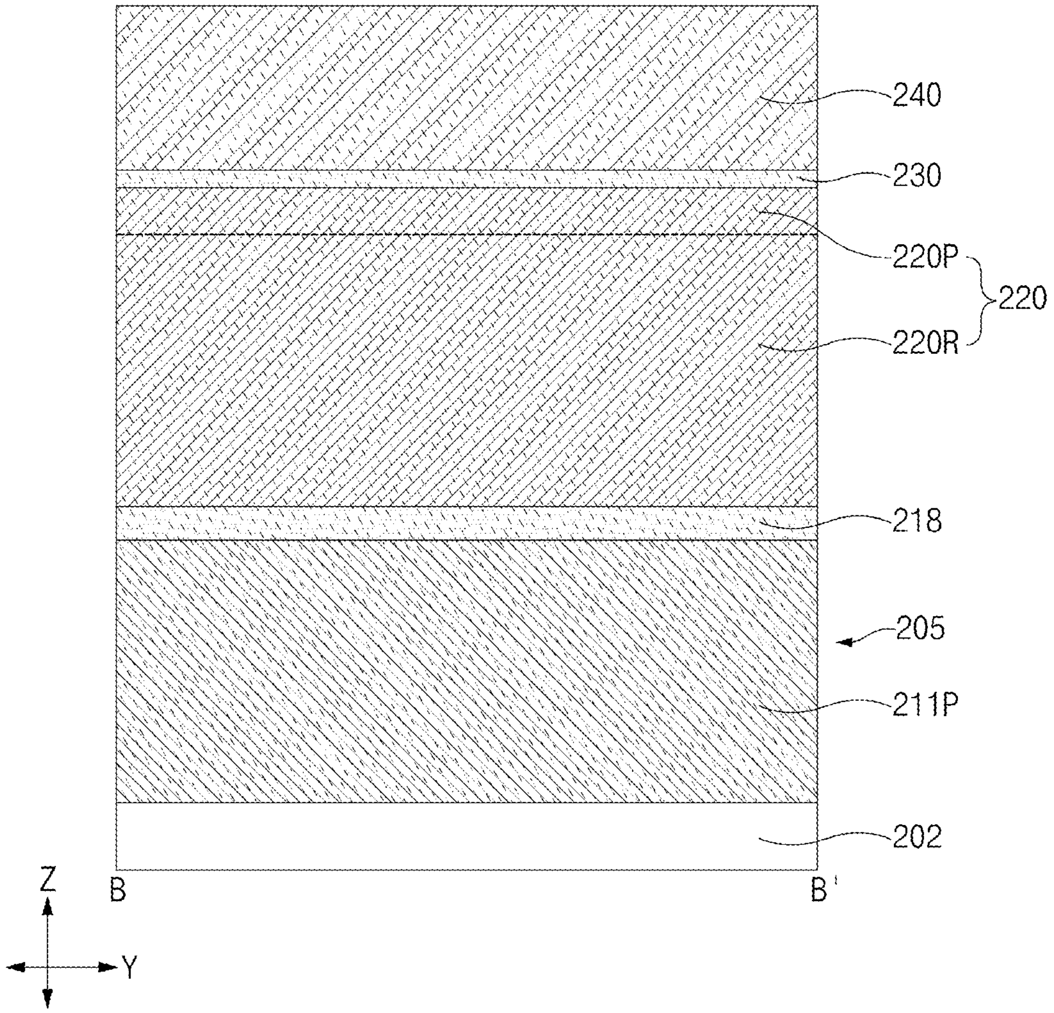
FIG. 22 is a longitudinal-sectional view illustrating the structure taken along line B-B' of FIG. 21.
Figure 23:
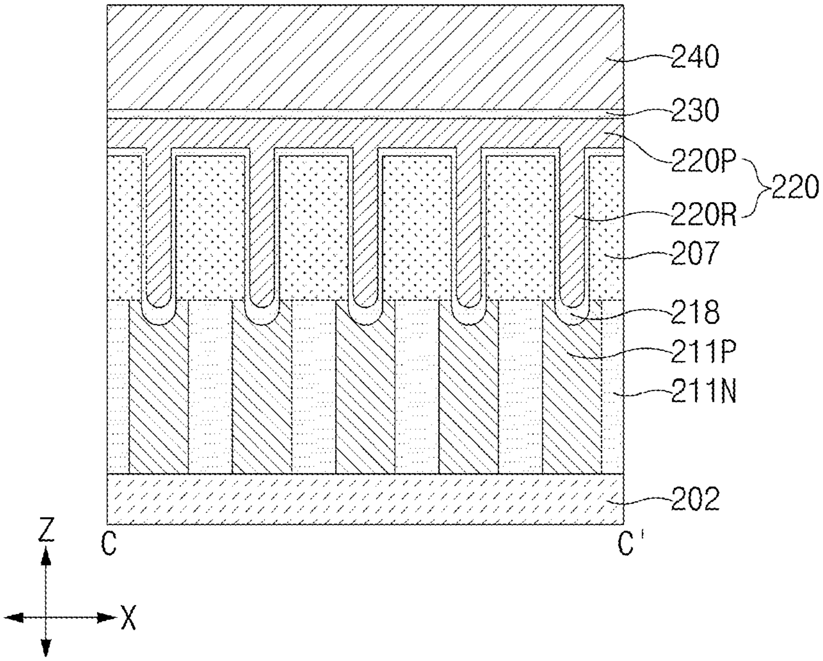
FIG. 23 is a longitudinal-sectional view illustrating the structure taken along line C-C' of FIG. 21.
Figure 24:
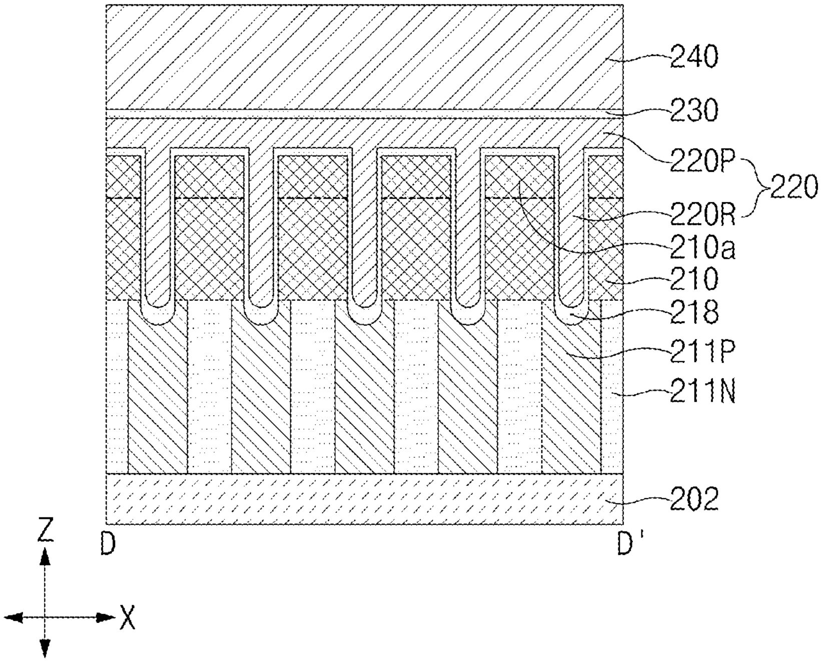
FIG. 24 is a longitudinal-sectional view illustrating the structure taken along line D-D' of FIG. 21.

FIG. 20 is a schematic perspective view illustrating the structure of a power semiconductor device, according to another embodiment of the present disclosure, and FIG. 21 is a cross-sectional view illustrating the structure taken along line A-A' of FIG. 20. FIGS. 22 to 24 are longitudinal sectional views illustrating the structure taken along lines B-B', C-C', and D-D' of FIG. 21.

Referring to FIGS. 20 to 24, a power semiconductor device 200 may include a semiconductor layer 205, a gate insulating layer 218, a gate electrode layer 220, an interlayer insulating layer 230, and a source electrode layer 240. For example, the power semiconductor device 200 may have a power MOSFET structure.

The semiconductor layer 205 may include at least one semiconductor material layer. For example, the semiconductor layer 205 may include one or multiple epitaxial layers. Alternatively, the semiconductor layer 205 may include a single epitaxial layer or multiple epitaxial layers formed on a semiconductor substrate. For example, the semiconductor layer 205 may include silicon carbide (SiC). Alternatively, the semiconductor layer 205 may include at least one SiC-epitaxial layer.

As silicon carbide (SiC) has a bandgap higher than a bandgap of silicon (Si), silicon carbide (SiC) may maintain stability even at a higher temperature, as compared to silicon (Si). Further, silicon carbide (SiC) exhibits a dielectric breakdown field remarkably higher than that of silicon (Si). Accordingly, silicon carbide (SiC) may stably work even at a higher voltage. Accordingly, the power semiconductor device 200 having the semiconductor layer 205 including silicon carbide (SiC) may exhibit a more excellent heat dissipation characteristic with a higher breakdown voltage, and may exhibit a stable operating characteristic at a higher temperature, when compared to silicon (Si)

The semiconductor layer 205 may include drift regions 207, N pillar regions 211N, and P pillar regions 211P. Hereinafter, the N pillar regions 211N and the P pillar regions 211P may be referred to as first pillar regions and second pillar regions, respectively.

The drift regions 207 and the N pillar regions 211N may be formed in the first conductive type (N type), and may be formed by implanting the first conductive type of impurities into a portion of the semiconductor layer 205. For example, the drift regions 207 and the N pillar regions 211N may be formed by implanting the first conductive type of impurities into the SiC-epitaxial layer. The impurity doping concentration of the drift regions 207 may equal to the impurity doping concentration of the N pillar regions 211N. The drift regions 207 and the N pillar regions 211N may be formed together through the same process (e.g., an impurity implanting process) or may be formed through separate processes.

The drift regions 207 may be formed between recess gates 220R to be spaced apart from each other in the X direction such that opposite sides of the drift region 207 in the X direction make contact with gate insulating layers 218. Each of the drift regions 207 may be formed such that opposite sides of the drift region 207 in the Y direction make contact with the well regions 210. Each of the drift regions 207 may be formed to extend in the Z direction to provide a vertical moving path of current.

The N pillar regions 211N may be positioned under the well regions 210 and the drift regions 207, such that top surfaces of the N pillar regions 211N make contact with the well regions 210 and the drift regions 207. For example, the N pillar regions 211N may be formed to longitudinally extend in the Y direction, such that the top surfaces of the N pillar regions 211N make contact with the drift regions 207 and the well regions 210 positioned at opposite sides of the drift regions 207.

The N pillar regions 211N may provide the moving path of a current, together with the drift regions 207. In other words, the top surface of each of the N pillar regions 211N is connected to a relevant portion of the bottom surface of the drift region 207. Accordingly, when the semiconductor device 200 operates, the current may flow in the vertical direction (Z direction) through the N pillar regions 211N and the drift regions 207.

The P pillar regions 211P may be formed in a second conductive type (P type) which is opposite to the first conductive type. The P pillar region 211P may be interposed between the N pillar regions 211N, such that opposite sides of the P pillar region 211P in the X direction make contact with the N pillar regions 211N. The P pillar regions 211P may be formed to longitudinally extend in the Y direction, in the same form as the form of the N pillar regions 211N. For example, the P pillar regions 211P and the N pillar regions 211N may be alternately and continuously formed while making contact with each other in the X direction. Each of the P pillar regions 211P may be positioned under the well region 210 and the recess gates 220R. For example, the P pillar regions 211P may be formed to be in contact with the well regions 210 and the drift region 207, while surrounding a lower portion (a region in which the edge of the P pillar region 211P is formed) of trenches 216 in which the recess gates 220R are formed. The P pillar regions 211P may be formed to make contact with the drift region 207 and the N pillar region 211N to form a super junction with the drift region 207 and the N pillar region 211N.

The well regions 210 may be formed to have a side surface making contact with the drift regions 207 and a bottom surface making contact with the N pillar regions 211N and the P pillar regions 211P, in the semiconductor layer 205. The well regions 210 may include the second conductive type of impurities, which is the same as that of the P pillar region 211P. For example, the well regions 210 may be formed by implanting the second conductive type of impurities into the SiC-epitaxial layer. The impurity doping concentration of the well regions 210 may equal to or higher than the impurity doping concentration of the P pillar regions 211P.

Figure 27:
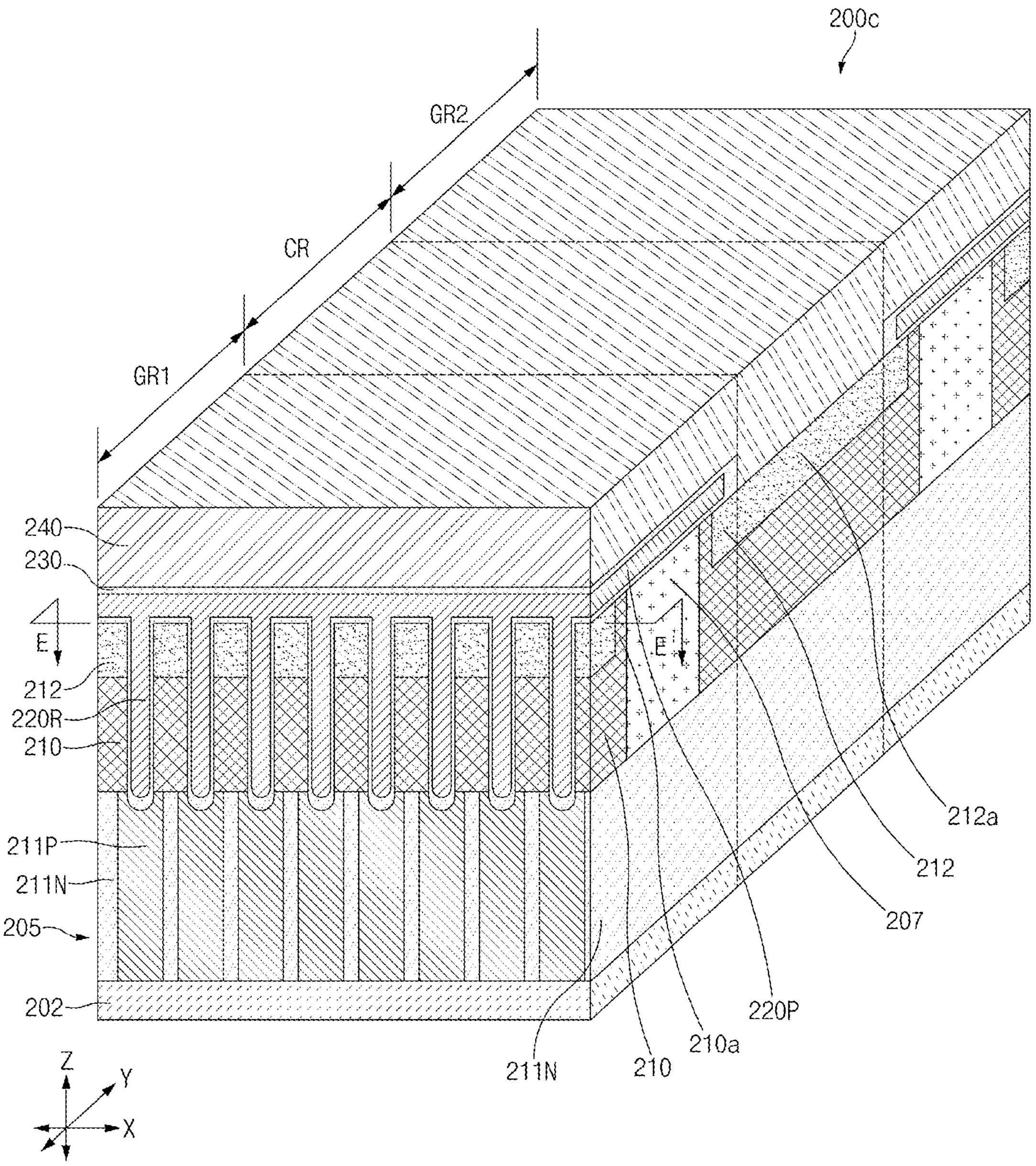
FIG. 27 is a schematic perspective view illustrating the structure of a power semiconductor device, according to another embodiment of the present disclosure.

The well regions 210 may be interposed between the recess gates 220R and may be positioned at opposite sides of the drift region 207 in the Y direction. Each of the well regions 210 may include a channel region 210*a*. Although the well regions 210 are positioned only between the recess gates 220R according to the present embodiment, the well regions 210 may be integrally connected to each other at a position further extending in the Y direction (an outer portion of the recess gates in the Y direction) as illustrated in FIG. 27. In addition, the well regions 210 connected to each other may be formed to surround the drift region 107, in an all-around form.

The source regions 212 may be formed in the well regions 210 and may be formed in the first conductive type. For example, the source regions 212 may be formed at opposite sides of the drift region 207 to be spaced apart from the drift region 207 in each well region 210, and may be formed by implanting the first conductive type of impurities into the well region 210. The impurity doping concentration of the source regions 212 may be higher than the impurity doping concentration of the drift region 207 and the N pillar region 211N.

Although the source regions 212 are positioned only between the recess gates 220R according to the present embodiment, the source regions 212 may be integrally connected to each other at a position further extending in the Y direction (an outer portion of the recess gates in the Y direction) as illustrated in FIG. 27 to be described below. In addition, when the well region 210 is formed to surround the drift region 207 in an all-around shape, the source regions 212 connected to each other may also be formed to surround the drift region 207, in an all-around shape.

The channel regions 210*a* may be interposed between the drift regions 207 and the source regions 212, in the well regions 210. The channel regions 210*a* may include the second conductive type of impurities, which is the same as the well regions 210. Since the channel regions 210*a* include impurities in the second conductive type opposite to the conductive type of the source regions 212 and the drift regions 207, the channel regions 210*a* may form a diode junction together with the source regions 212 and the drift regions 207. Accordingly, since the channel regions 210*a* do not allow the movement of charges when the power semiconductor device 200 does not operate, the channel regions 210*a* may electrically isolate the drift regions 207 from the source regions 212. To the contrary, when an operating voltage is applied to the gate electrode layer 220, the channel regions 210*a* allow charges to move, as an inversion channel is formed inside the channel regions 210*a*. Accordingly, the channel regions 210*a* may electrically connect the drift regions 207 to the source regions 212.

Although FIG. 20 illustrates that the channel regions 210*a* are displayed to be distinguished from the well regions 210, the channel regions 210*a* may be some of the well regions 210. The channel regions 210*a* may correspond to a region interposed between the drift regions 207 and the source regions 212, in the well regions 210. The doping concentration of impurities of the channel regions 210*a* may be equal to the doping concentration of impurities of the well region 210, or different from the doping concentration of impurities of the well region 210 to adjust a threshold voltage.

According to an embodiment, the well regions 210, the channel regions 210*a*, and the source regions 212 may be formed to be symmetric to each other about the drift region 207 in the Y direction. For example, each of the well regions 210, the channel regions 210*a*, and the source regions 212 may include first parts and second parts positioned at opposite sides of the drift region 207 in the Y direction. The well region 210, and the source regions 212 may be separated from each other by the drift region 207, or may be connected to each other to surround the drift region 207.

In addition, a drain region 202 may be formed in the semiconductor layer 205 under the pillar regions 211N and 211P and may include the first conductive type of impurities. For example, the drain region 202 may include the first conductive type of impurities implanted at a doping concentration higher than the concentration of the first conductive type of impurities of the N pillar regions 211N and the drift region 207.

According to an embodiment, the drain region 202 may be provided as a SiC-substrate in the first conductive type. In this case, the drain region 202 may be formed as a portion of the semiconductor layer 205 or a substrate separate from the semiconductor layer 205.

At least one trench 216 may be formed to be recessed into the semiconductor layer 205 from a surface of the semiconductor layer 205 by a specific depth. At least one trench 216 may include a plurality of trenches spaced apart from each other in the X direction. The trenches 216 may extend in parallel in the Y direction by a specific length such that the trenches 216 make contact with the drift regions 207, and the channel regions 210*a* and the source regions 212 which are positioned at opposite sides of the drift regions 207, in the semiconductor layer 205.

The channel regions 210*a* may be interposed between the trenches 216. The drift regions 207 may be spaced apart from each other by the trenches 216. According to an embodiment, the drift regions 207 may be provided in the form of a partition between the trenches 216, and the channel regions 210*a* may be positioned symmetrically to each other at opposite sides of each drift region 207 in the Y direction. The source regions 212 may be positioned at one side of the channel regions 210*a*.

The gate insulating layer 218 may be formed on at least inner surfaces (side surfaces and a bottom surface) of the trenches 216. For example, the gate insulating layer 218 may be formed on the inner surfaces of the trenches 216 and on the semiconductor layer 205 outside the trenches 216. The whole thickness of the gate insulating layer 218 may be uniform, or a portion, which is formed on the bottom surface of the trench 216, of the gate insulating layer 218 may be thicker than a portion, which is formed on the side surface of the trench 216, of the gate insulating layer 218, such that an electric field is reduced at a bottom surface of the trench 216.

The gate insulating layer 218 may include an insulating material, such as a silicon oxide, an SiC oxide, a silicon nitride, a hafnium oxide, a zirconium oxide, or an aluminum oxide, or a stacked structure thereof.

A gate electrode layer 220 may be formed on the gate insulating layer 218 to fill the trench 216. In addition, the gate electrode layer 220 may be formed on the gate insulating layer 218 on the semiconductor layer 205 to cover at least the channel region 210*a*. For example, the gate electrode layer 220 may include a plurality of recess gate electrodes 220R spaced apart from each other in an X direction and formed to be buried in the trench 216. In addition, the gate electrode layer 220 may include a plate gate electrode 220P provided in a flat plate form on the semiconductor layer 205 to connect the plurality of recess gate electrodes 220R to each other while covering the channel regions 210*a*

According to the present embodiment, the power semiconductor device 200 may have the structure, in which the source region 212, the channel region 210*a*, and the drift region 207 connected to each other in the Y direction, interposed between the plurality of recess gate electrodes 220R provided under the plate gate electrode 220P. For example, the channel regions 210*a* is interposed between the recess gates 220R, such that the channel regions 210*a* make contact with opposite side surfaces of the drift region 207 in the Y direction, and the source region 212 may be formed to be connected to one side surface of each of the channel regions 210*a*. The drift region 207, the channel region 210*a*, and the source region 212, which are connected to each other, may serve as a moving path of the current, when the power semiconductor device 200 operates.

As described above, according to the present embodiment, the power semiconductor device 200 includes a multilateral channel structure having the moving path of the current, in which the drift region 207, the channel region 210*a*, and the source region 212 are connected to each other, formed between the plurality of gate electrodes 220R, such that more charges simultaneously move. In addition, on the moving path of the current, the gate electrode layer 220 is formed to surround three surfaces (a top surface and opposite surfaces in the X direction) of the drift region 207, the channel region 210*a*, and the source region 212, such that more charges simultaneously move. The gate electrode layer 220 may include a conductive material, such as polysilicon, metal, a metal nitride, or a metal silicide, or may include a stack structure thereof.

An interlayer insulating layer 230 may be formed on the gate electrode layer 220. The interlayer insulating layer 230 may include an insulating material, such as an oxide layer, a nitride layer, or the stack structure thereof, for electrical insulation between the gate electrode layer 220 and the source electrode layer 240.

The source electrode layer 240 may be formed on the interlayer insulating layer 230 and may be electrically connected with the source regions 212. The source electrode layer 240 may include a conductive material such as metal.

Although the above description has been made in that the first conductive type and the second conductive type are an N type and a P type, according to an embodiment described above, the first conductive type and the second conductive type may be the P type and the N type In more detail, when the power semiconductor device 200 is an N-type MOSFET, the drift region 207 and the N pillar region 211N may be N− regions, the source region 212 and the drain region 202 may be N+ regions, and the well region 210, the P pillar region 211P, and the channel region 210*a* may be P− regions.

According to the present embodiment, in the power semiconductor device 200, when a current flows from the drain region 202 to the source region 212, the current may flow in a vertical direction (Z direction) along the N pillar region 211N and the drift region 207, and flow to the source region 212 through the channel region 210*a*.

In the power semiconductor device 200 according to the present embodiment, the recess gates 220R in the trenches 216 may be densely arranged in parallel in a stripe type or a line type, and the channel regions 210*a* may be interposed between the recess gate 220R, thereby increasing the channel density.

When the operating voltage is applied to the gate electrode layer 220, the electric field may be concentrated to the lower corner parts of the recess gates 220R. When the electric field is concentrated, the gate insulating layer 218 in the relevant region may receive severe stress, so dielectric breakdown of the gate insulating layer 218 may be caused. In addition, in the power semiconductor device 200 according to the present embodiment, the P pillar regions 211P may be formed to surround the lower portion of the trench 216, thereby mitigating the concentration of the electric field to the lower corner part of the gate electrode layer 220, such that the dielectric breakdown of the gate insulating layer 218 may be prevented.

In the power semiconductor device 200 according to the present embodiment, the width (the length in the X direction) of the N pillar regions 211N, which serves as the moving path of a current, is narrowed due to the P pillar regions 211P, thereby increasing the resistance (JFET resistance). However, in the power semiconductor device 200 according to the present embodiment, as illustrated in FIG. 6, the JFET resistance may be reduced by adjusting a charge amount in the P pillar region 211P and a charge amount in the N channel region 211N.

Figure 25:
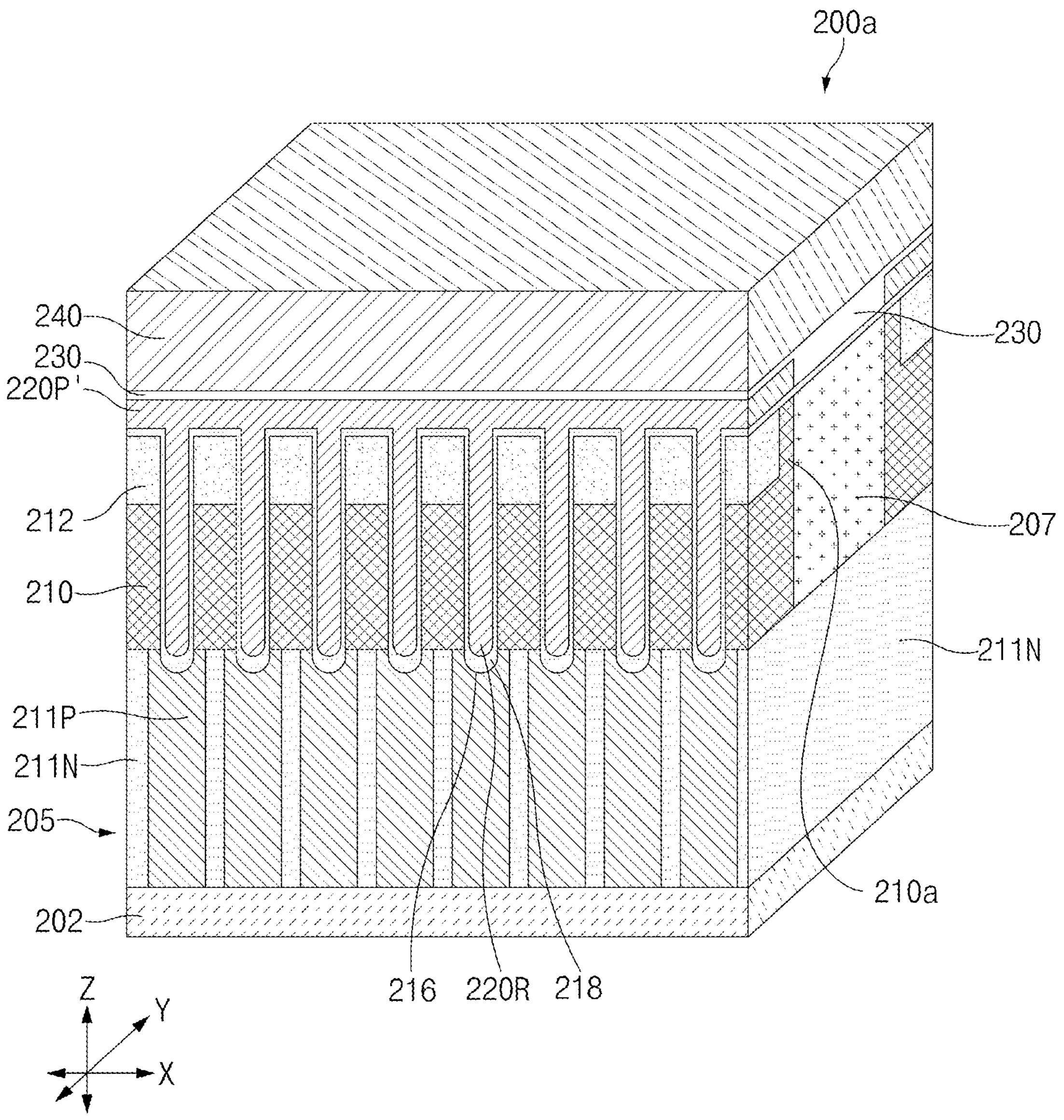
FIG. 25 is a schematic perspective view illustrating the structure of a power semiconductor device, according to another embodiment of the present disclosure.

FIG. 25 is a schematic perspective view illustrating the structure of a power semiconductor device, according to another embodiment of the present disclosure.

A power semiconductor device 200*a* according to the present embodiment is formed by partially modifying the structure of the power semiconductor device 200 as illustrated in FIGS. 20 to 24. Accordingly, the duplicated description of the structure will be omitted to avoid redundancy.

Referring to FIG. 25, in the power semiconductor device 200*a* according to the present embodiment, a plate gate 220P' may be formed in a separate form as illustrated in FIGS. 8 and 9, instead of one integral flat plate form.

However, according to the present embodiment, the plate gate 220P' may be provided in a form having no gate electrode layer on the drift region 207. In other words, the gate electrode layer 220 has a form, in which the recess gates 220R are present only on opposite side walls of the drift regions 207, regarding the drift regions 207, and may have a form in which the recess gate 220R and the plate gate 220P' surround three surfaces of the channel regions 210*a* and the source regions 212 in an inverse U shape, regarding the channel regions 210*a* and the source regions 212.

Figure 26:
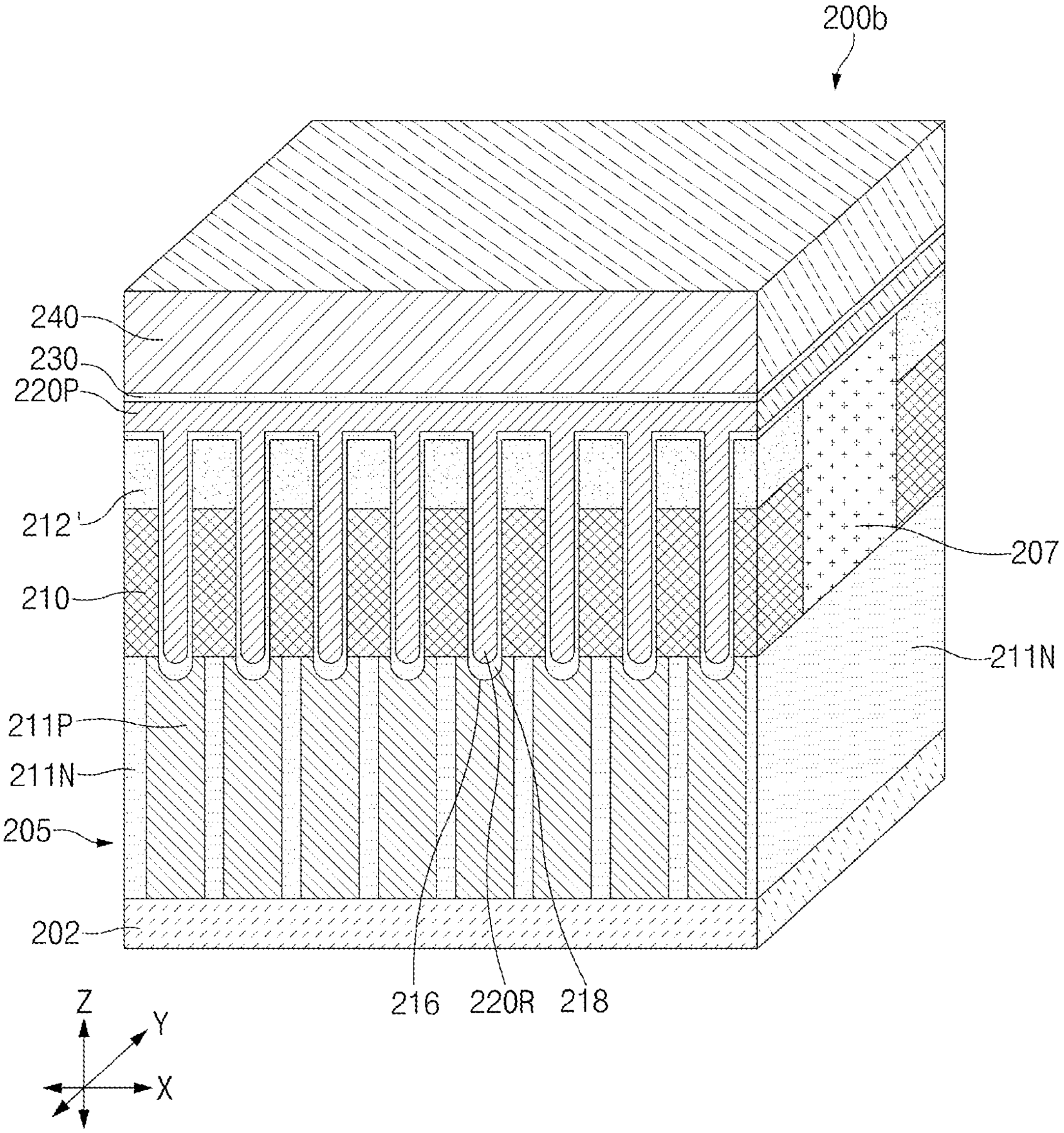
FIG. 26 is a schematic perspective view illustrating the structure of a power semiconductor device, according to another embodiment of the present disclosure.

FIG. 26 is a schematic perspective view illustrating the structure of a power semiconductor device, according to another embodiment of the present disclosure.

A power semiconductor device 200*b* according to the present embodiment is formed by partially modifying the structure of the power semiconductor device 200 as illustrated in FIGS. 20 to 24. Accordingly, the duplicated description of the structure will be omitted to avoid redundancy.

Referring to FIG. 26, according to the present embodiment, the power semiconductor device 200*b* may have source regions 212' formed to make contact with the drift region 207. The source regions 212' may include the first conductive type of impurities, which is the same as the source regions 212.

In the structure of the SiC semiconductor layer 205, a potential barrier is formed on the moving path of the current due to negative charges, which are generated, as a carbon cluster is formed on the gate insulating layer 218, thereby blocking the current from moving. Accordingly, as in the present embodiment, even if the source regions 212' are formed to make contact with the drift region 207, when the operating voltage is applied to the gate electrode layer 220, an accumulation channel may be formed to allow the flow of the current. In this case, the operating voltage may be remarkably lower than an operating voltage for forming an inversion channel in the channel region 210*a* of FIG. 19.

Figure 28:
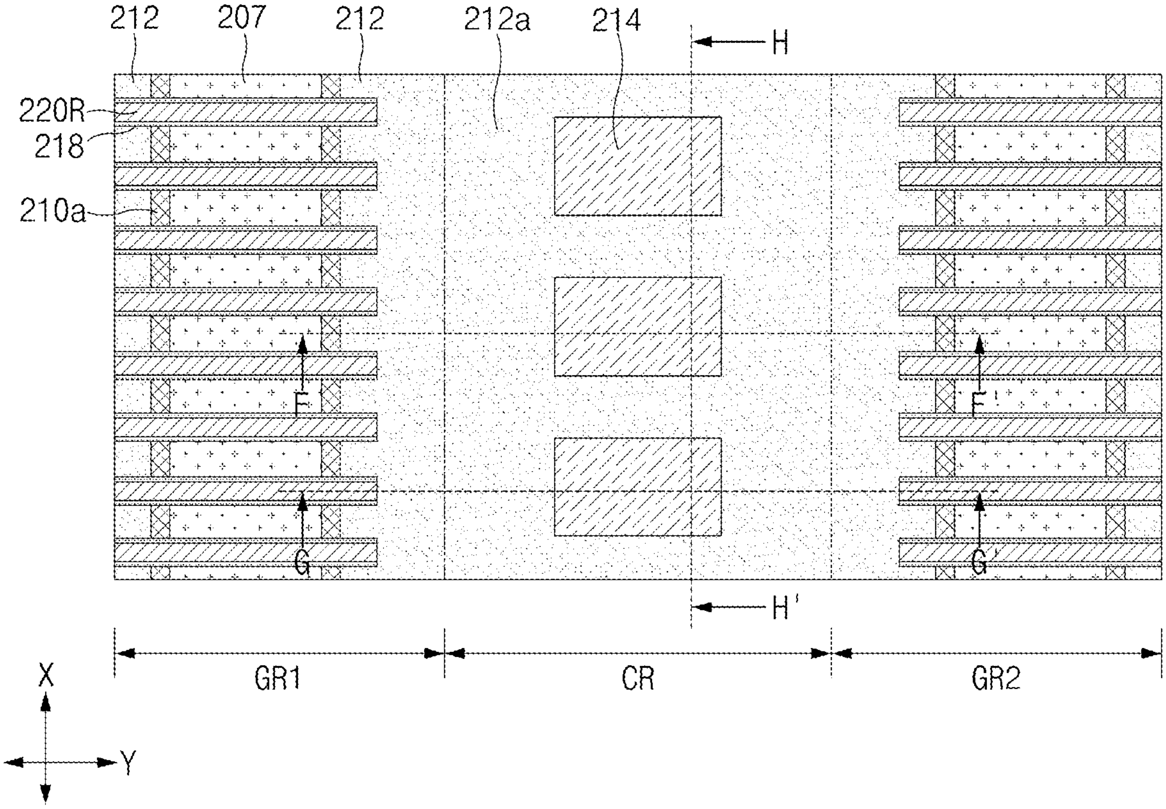
FIG. 28 is a cross-sectional view illustrating the structure taken along line E-E' of FIG. 27.
Figure 29:
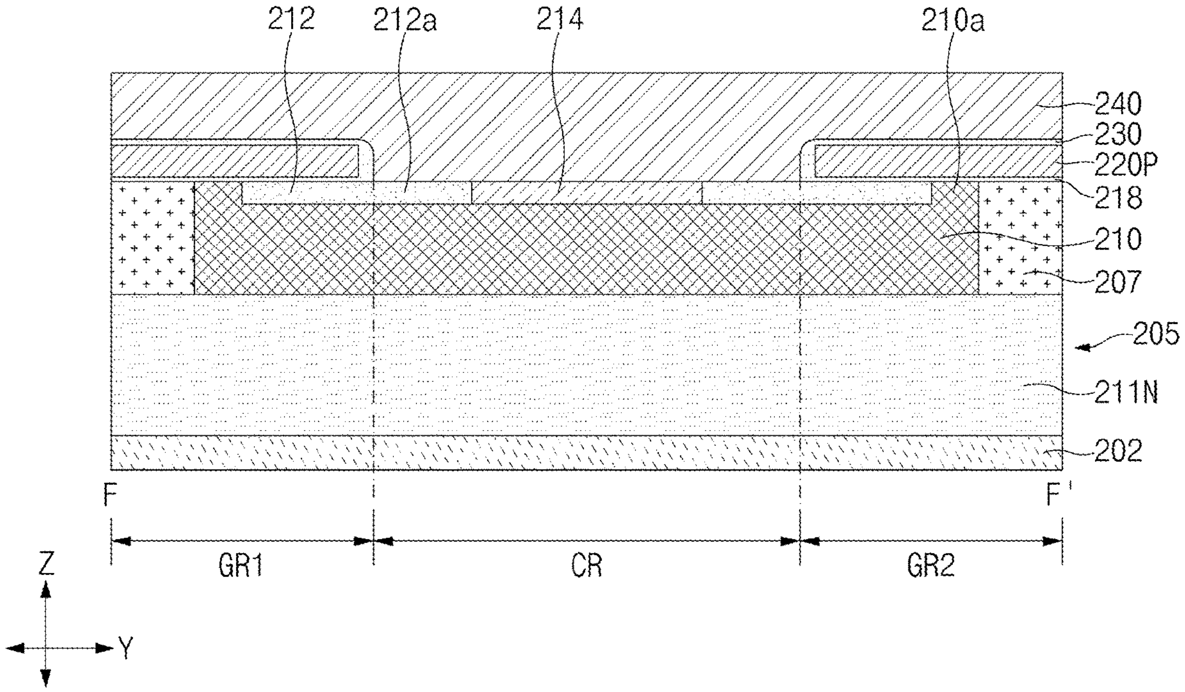
FIG. 29 is a longitudinal-sectional view illustrating the structure taken along line F-F' of FIG. 28.
Figure 30:
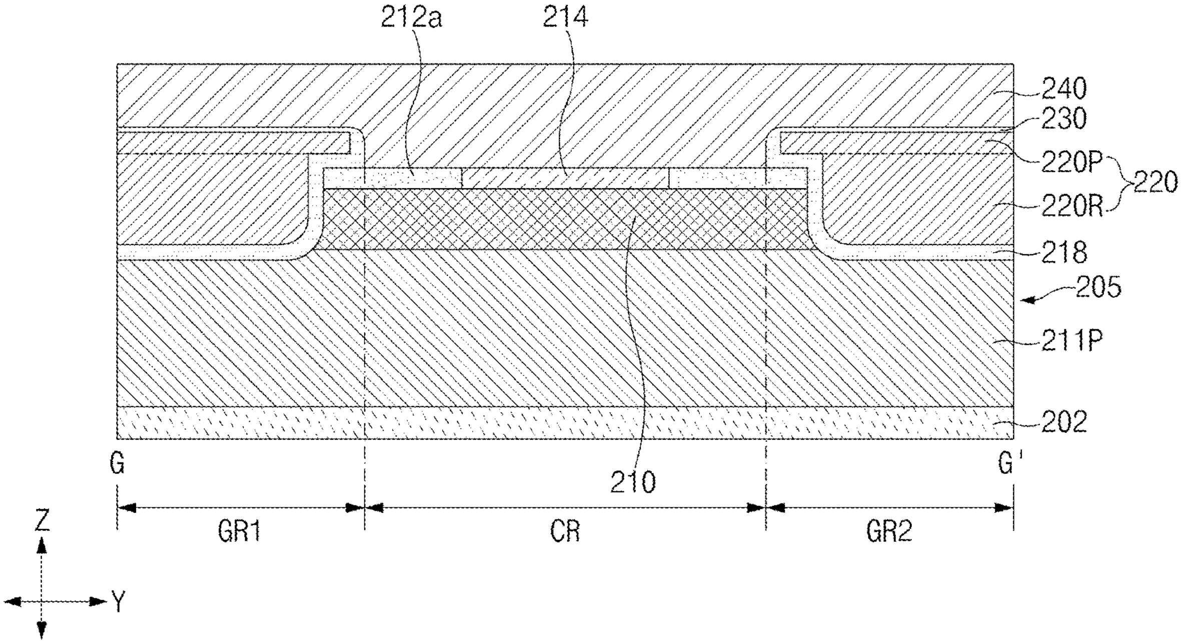
FIG. 30 is a longitudinal-sectional view illustrating the structure taken along line G-G' of FIG. 28.
Figure 31:
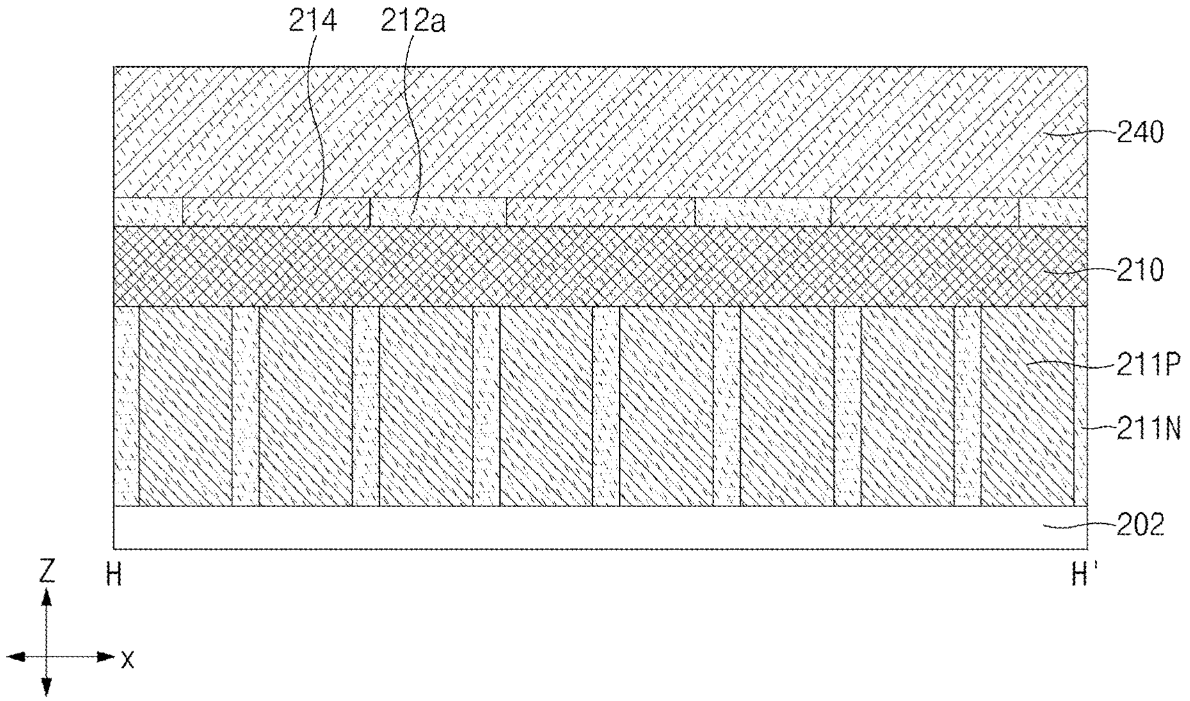
FIG. 31 is a longitudinal-sectional view illustrating the structure taken along line H-H' of FIG. 28.

FIG. 27 is a schematic perspective view illustrating the structure of a power semiconductor device, according to another embodiment of the present disclosure, and FIG. 28 is a cross-sectional view illustrating the structure taken along line E-E' of FIG. 27. FIGS. 29 to 31 are longitudinal sectional views illustrating the structure taken along lines F-F', G-G', and H-H' of FIG. 28.

According to the present embodiment, a power semiconductor device 200*c* is formed by employing or partially modifying the power semiconductor device 200 of FIG. 20. Accordingly, the duplicated description will be omitted to avoid redundancy.

Referring to FIGS. 27 to 31, the power semiconductor device 200*c* may include at least one gate region GR1 or GR2 and a contact region CR.

The gate regions GR1 and GR2, which include the gate electrode layer 220, may include the structure as illustrated in FIG. 20, FIG. 25, or FIG. 26, as described above. FIG. 27 illustrates an embodiment in which the gate regions GR1 and GR2 include the structure as illustrated in FIG. 20. Accordingly, the details of the gate regions GR1 and GR2 will be omitted.

The contact region CR, which is to connect source regions 212 of the gate regions GR1 and GR2 to the source electrode layer 240, may be interposed between the gate regions GR1 and GR2. When the power semiconductor device 200*c* includes only one gate region GR1 or GR2, the contact region CR may be positioned at one side of the relevant gate region GR1 or GR2.

The contact region CR may include the N pillar region 211N, the P pillar region 211P, the well region 210, the source contact region 212*a*, the well contact region 214, and a source electrode layer 240.

The N pillar region 211N and the P pillar region 211P of the contact region CR may be integrally formed with the N pillar region 211N and the P pillar region 211P of each of the gate regions GR1 and GR2. For example, the N pillar region 211N and the P pillar region 211P may longitudinally extend in the Y direction across the gate regions GR1 and GR2 and the contact region CR.

The well region 210 of the contact region CR may be formed to be integrally with the well regions 210 of the gate regions GR1 and GR2. For example, the well regions 210 of the gate regions GR1 and GR2 may extend to the contact region CR in the Y direction, and the extending well regions 210 may be commonly and integrally connected to outer portions of the recess gates 220R.

The source contact regions 212*a* are to connect the source regions 212 to the source electrode layer 240. The source contact regions 212*a* may be formed to be integrally with the source regions 212 of the gate regions GR1 and GR2. For example, the source regions 212 of the gate regions GR1 and GR2 may extend to the contact region CR in the Y direction, and the extending source regions 212 may be commonly and integrally connected to outer portions of the recess gates 220R. In this case, parts, which are commonly and integrally connected to the outer portions of the recess gates 220R, may be the source contact regions 212*a*. Accordingly, the source contact region 212*a* may be a portion of the source regions 212. The source regions 212 may be electrically connected to the source electrode layer 240 through the source contact region 212*a*.

A well contact region 214 may be formed in the source contact region 212*a*. For example the well contact region 214 may extend from the well region 210 to pass through the source contact region 212*a*. The well contact region 214 may be formed inside one source contact region 212*a* or multiple source contact regions 212*a*.

The well contact region 214 may include the second conductive type of impurities. For example, the well contact region 214 may be doped with the second conductive type of impurities at a higher concentration than the concentration of the well region 210 to reduce a contact resistance when connected to the source electrode layer 240. For example, the well contact region 214 may be a P+ region.

The source electrode layer 240 of the contact region CR may be formed to be integrally connected to the source electrode layer 240 of the gate regions GR1 and GR2. The source electrode layer 240 may be commonly connected to the source contact region 212*a* and the well contact region 214.

The plate gate electrode 220P of each of the gate regions GR1 and GR2 may be formed to extend to boundary regions between the contact region CR, and each of the gate regions GR1 and GR2 in the Y direction. For example, as illustrated in FIG. 27, the plate gate electrode 220P may more longitudinally extend in the Y direction, such that the plate gate electrode 220P is closer to the contact region CR, as compared to the recess gate electrodes 220R.

Although FIGS. 27 to 31 illustrate that the source contact region 212*a* and the well contact region 214 are formed only at one side of each of the drift region 207, when the source region 212 and the well regions 210 are divided by the drift region 207, the source contact region 212*a* and the well contact region 214 may be formed at opposite sides of the drift region 207. For example, when the source regions 212 and the well regions 210 provided at opposite sides of the drift region 207 are electrically connected to each other, the contact region CR may be formed only at one side of the drift region 207 as illustrated in FIG. 27. To the contrary, when the source regions 212 and the well regions 210 provided at opposite sides of the drift region 207 are electrically isolated from each other, the contact regions CR may be formed at opposite sides of the dift region 207

As the power semiconductor device 200*c* in FIG. 27 may include two gate regions GR1 and GR2 and one contact region CR formed between the gate regions GR1 and GR2, one contact region CR is commonly connected to the two gate regions GR1 and GR2. However, the power semiconductor device 200*c* may include one gate region GR1 or GR2 and one contact region CR formed at one side of the gate region GR1 or GR2. In this case, the contact region CR may be formed at one side of the gate region GR1 or GR2 in the X direction or the Y direction.

In addition, the power semiconductor device 200*c* may include a plurality of gate regions and a plurality of contact regions interposed between the gate regions. For example, the power semiconductor device 200*c* may include at least three gate regions arranged to be spaced apart from each other by a specific distance in the Y direction, and a plurality of contact regions, each of which is interposed between adjacent gate regions. In this case, the structure of the adjacent gate regions and the contact region interposed between the adjacent gate regions may be the same as the structure in FIG. 27 to FIG. 31.

Figure 32:
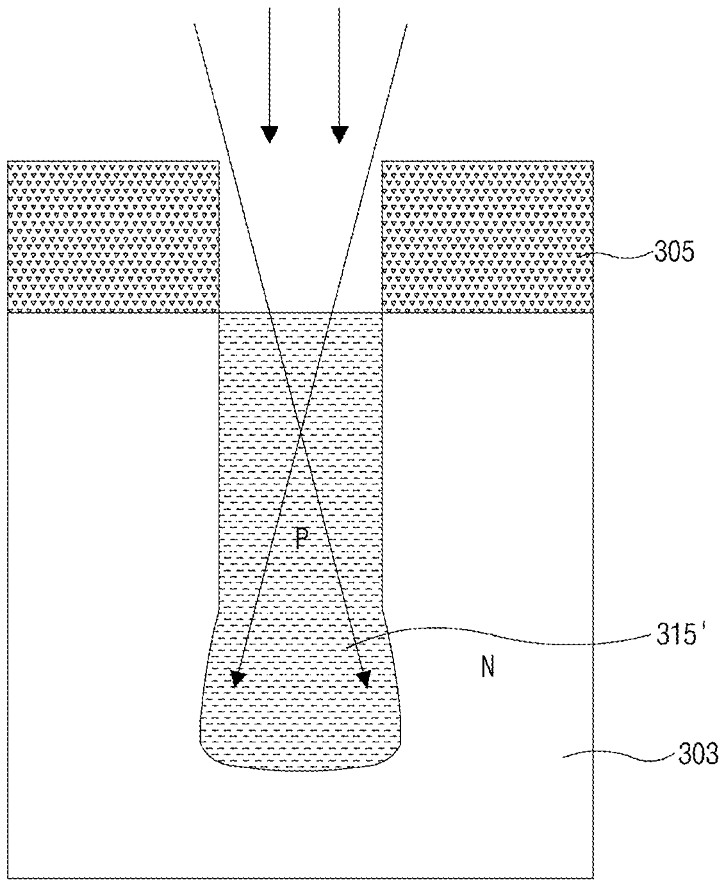
FIGS. 32 to 34 are perspective views schematically illustrating a method for fabricating an insulating-layer protective region surrounding a lower portion of the recess gate.
Figure 33:
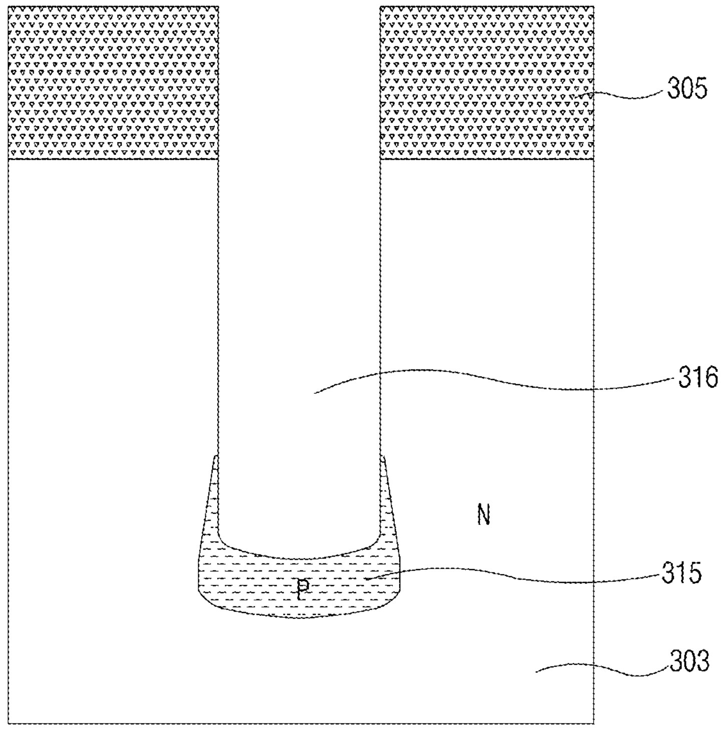
Figure 34:
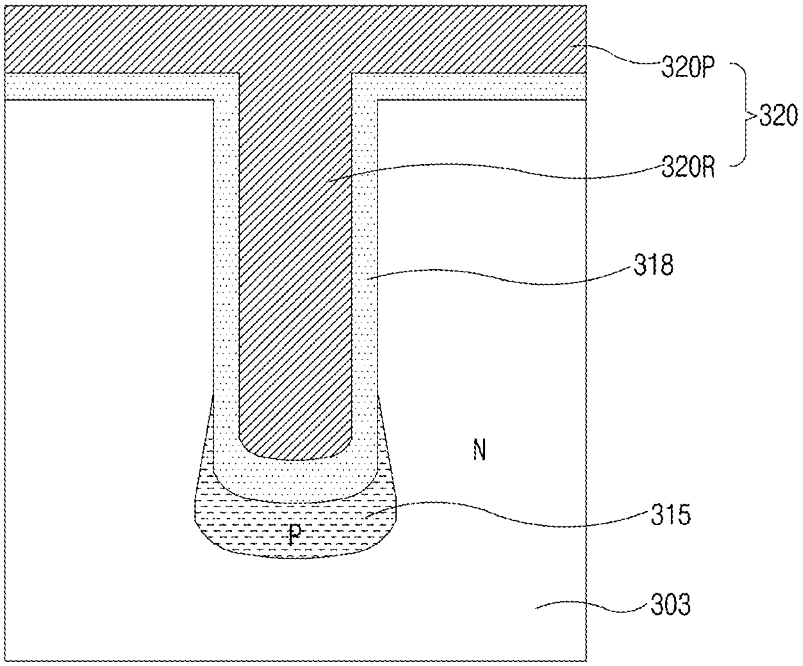

FIGS. 32 to 34 are perspective views schematically illustrating a method for fabricating an insulating-layer protective region surrounding a lower portion of the recess gate.

Referring to FIG. 32, a mask pattern 305 may be formed on a semiconductor layer 303, which is implanted with the first conductive type of impurities, to define a region for a trench for a recess gate. In this case, the mask pattern 305 may include a photoresist layer pattern. For example, the mask pattern 305 to expose a surface of the region for trench for recess gate may be formed on the semiconductor layer 303 by performing an exposing process and a developing process, after forming a photoresist layer on the semiconductor layer 303.

The semiconductor layer 303 may include at least one semiconductor material layer. For example, the semiconductor layer 303 may include one or multiple epitaxial layers. Alternatively, the semiconductor layer 303 may include a single epitaxial layer or multiple epitaxial layers formed on a semiconductor substrate. For example, the semiconductor layer 303 may include silicon carbide (SiC). Alternatively, the semiconductor layer 303 may include at least one SiC-epitaxial layer. The semiconductor layer 303 may provide a moving path of a current, when the operating current is applied to the gate electrode layer 320.

Thereafter, a sacrificial impurity region 315' may be formed in the semiconductor layer 303 by implanting the second conductive type of impurities into the semiconductor layer 303 using the mask pattern 305 as an ion implanting barrier layer. The sacrificial impurity region 315' may be formed to be deeper than the gate trench to be formed in a subsequent process, and a lower portion of the sacrificial impurity region 315' may be formed to have a width greater than that of the gate trench. For example, as an implantation angle is adjusted when impurities are injected, the sacrificial impurity region 315' may be formed such that the lower region of the sacrificial impurity region 315' has a width greater than that of an upper region of the sacrificial impurity region 315', similarly to the shape of a bulb.

Next, referring to FIG. 33, the trench 316 for a gate and the insulating-layer protective region 315 may be formed by etching the semiconductor layer 303 to a specific depth using the mask pattern 305 as an etching barrier layer. In this case, the trench 316 may be formed such that the bottom surface of the trench 316 is higher than the bottom surface of the sacrificial impurity region 315'. For example, as the photoresist layer pattern used as the ion implanting barrier layer is used as an etching barrier layer, the semiconductor layer 303 is etched to a depth shallower than the bottom surface of the sacrificial impurity region 315'. Accordingly, the region for the trench 316 may be removed from the sacrificial impurity region 315', and only a region, which surrounds a lower corner region of the trench 316, of the sacrificial impurity region 315' remains to form the insulating-layer protective region 315.

Figure 18:
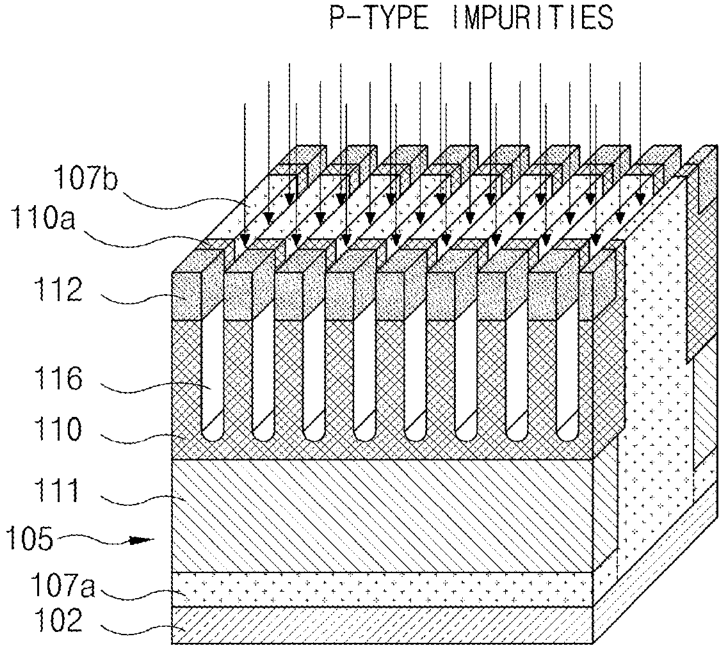

As illustrated in FIG. 18 described above, after the trench is first formed in the semiconductor layer 303, impurity is implanted into the lower portion of the trench, impurities reflected from the inner surface of the trench may be implanted into a peripheral portion of a sidewall of the trench. In other words, the region having the second conductive type of impurities is formed even in the peripheral portion of the sidewall of the trench as well as the lower portion of the trench, thereby severely interrupting the moving of a current. Therefore, according to the present embodiment, after first implanting impurities into the semiconductor layer 303, the trench 316 is formed such that the lower portion of the trench partially remains in the relevant impurity region.

Thereafter, referring to FIG. 34, the gate insulating layers 318 may be formed on the bottom surface and the side surface of each trench 316. The gate insulating layer 318 may be formed on the semiconductor layer 303 which is an outer portion of the trench 316. The gate insulating layer 318 may be formed to include an oxide to oxidize the semiconductor layer 303 or may be formed by depositing an insulating material, such as an oxide or a nitride, on the semiconductor layer 303. The whole thickness of the gate insulating layer 318 may be uniform, or a portion of the gate insulating layer 318 formed on the bottom surface of the trench 316 may be thicker than a portion of the gate insulating layer 318 formed on a side wall of the trench 316, such that an electric field is reduced at a bottom part of the trench 316.

Thereafter, the gate electrode layer 320 may be formed by providing a gate electrode material onto the gate insulating layer 318 such that the trenches 316 is buried. The gate electrode layer 320 may be formed by implanting impurities into polysilicon or may be formed to include conductive metal or a metal silicide.

FIGS. 35 to 38 are perspective views schematically illustrating a method for fabricating an insulating-layer protective region surrounding a lower portion of the recess gate, according to another embodiment of the present disclosure.

Figure 35:
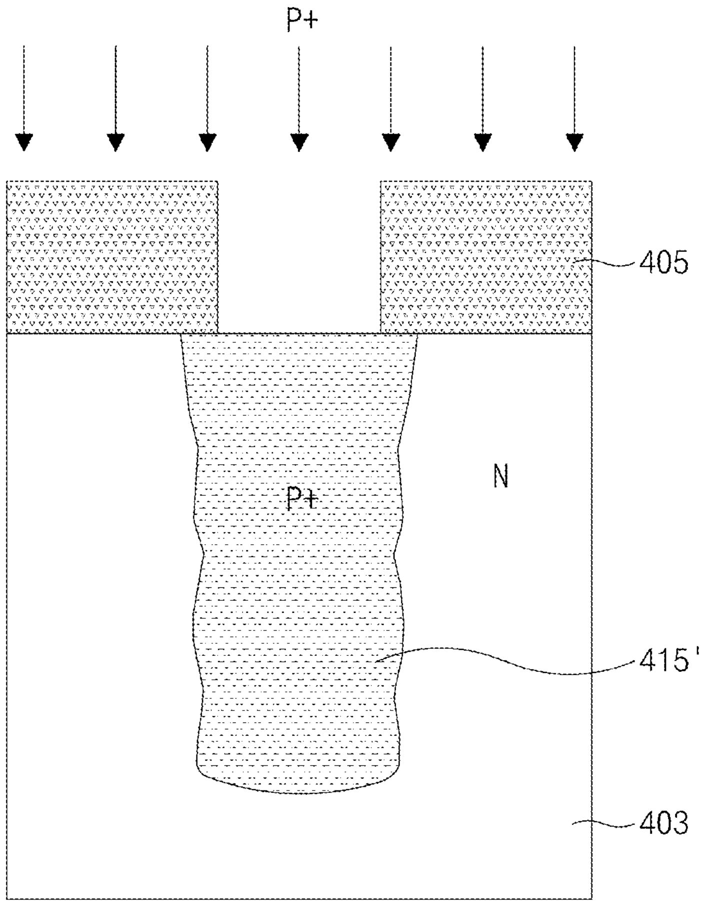
FIGS. 35 to 38 are perspective views schematically illustrating a method for fabricating an insulating-layer protective region surrounding a lower portion of the recess gate, according to another embodiment of the present disclosure.

Referring to FIG. 35, a mask pattern 405 may be formed on a semiconductor layer 403, which is implanted with the first conductive type of impurities, to define a region for a trench for a gate. In this case, the mask pattern 403 may include a photoresist layer pattern. For example, the mask pattern 405 to expose a surface of the region for trench for the gate may be formed on the semiconductor layer 403 by performing an exposing process and a developing process, after forming a photoresist layer on the semiconductor layer 403.

The semiconductor layer 403 may include at least one semiconductor material layer. For example, the semiconductor layer 403 may include one or multiple epitaxial layers. Alternatively, the semiconductor layer 403 may include a single epitaxial layer or multiple epitaxial layers formed on a semiconductor substrate. For example, the semiconductor layer 403 may include silicon carbide (SiC). Alternatively, the semiconductor layer 403 may include at least one SiC-epitaxial layer.

Thereafter, a sacrificial impurity region 415' may be formed in the semiconductor layer 403 by implanting the second conductive type of impurities at a higher concentration into the semiconductor layer 403 using the mask pattern 405 as an ion implanting barrier layer. A first sacrificial impurity region 415' may be formed to be deeper than the gate trench to be formed in a subsequent process, and a lower portion of the first sacrificial impurity region 415' may be formed to have a width greater than that of the gate trench.

However, when impurities are implanted at the higher concentration, the first sacrificial impurity region 415' may be formed over a region wider than the region for the trench for a gate to be formed in the subsequent process due to diffusion of the impurities. For example, the first sacrificial impurity region 415' may not be formed to surround only the lower portion of the trench for the gate to be formed in the subsequent process, but may be formed to have a size that entirely surrounds the gate trench. In this case, when the power semiconductor device operates, the resistance (JFET resistance) in the moving path of the current may be greatly increased.

Figure 36:
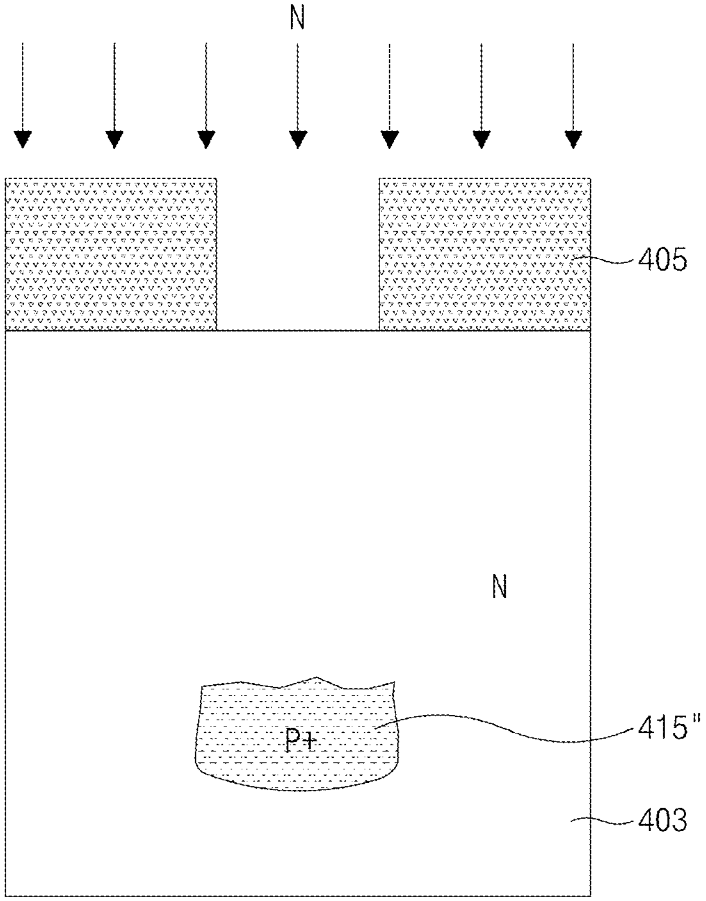

Next, referring to FIG. 36, to prevent an increase in resistance due to diffusion of impurities described above, the first conductive type of impurities are implanted into the semiconductor layer 403 using the mask pattern 405 as an ion implanting barrier layer. For example, a second sacrificial impurity region 415" may be formed by implanting the first conductivity type of impurities into the semiconductor layer 403 such that only the lower portion of the first sacrificial impurity region 415' remains to a specific height, and a remaining portion of the first sacrificial impurity region 415' is removed.

Figure 37:
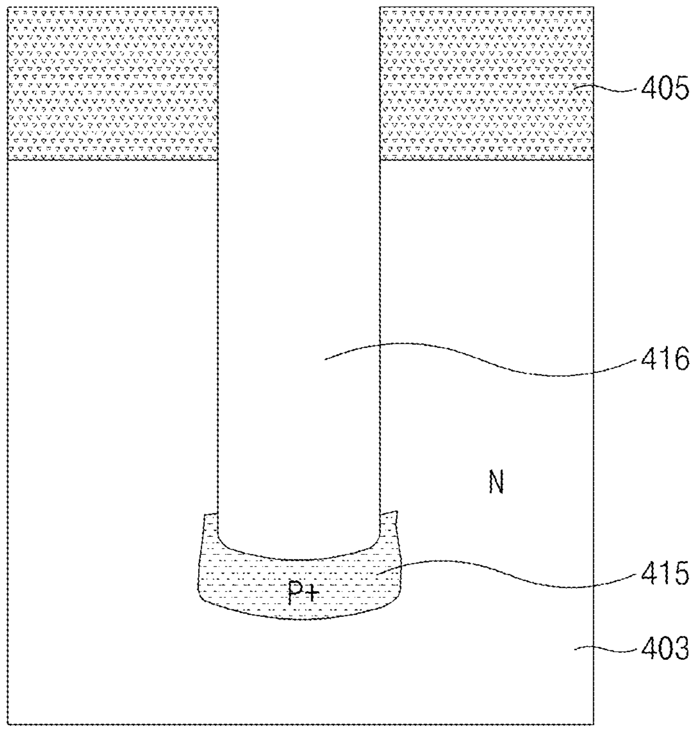

Next, referring to FIG. 37, the trench 416 for a gate and the insulating-layer protective region 415 may be formed by etching the semiconductor layer 405 and the second sacrificial impurity region 415" using the mask pattern 403 as the etching barrier layer. In this case, the trench 416 for the gate has the bottom surface lower than the top surface of the second sacrificial impurity region 415" and higher than the bottom surface of the second sacrificial impurity region region 415".

For example, the trench 416 for the gate is formed using a photoresist layer pattern, which is used as the ion implanting barrier layer, as the etching barrier layer. In this case, the trench 416 for the gate may be formed to a depth at which a lower portion (lower corner portion) of the trench 416 is surrounded by the second sacrificial impurity region 415".

When impurities are implanted into the trench, after the trench is first formed in the semiconductor layer 403, the impurities reflected from the inner surface of the trench may be implanted into a peripheral portion of a sidewall of the trench, such that the region having the second conductive type of impurities surrounds only the lower portion of the trench 416. In other words, the region having the second conductive type of impurities is formed even in the peripheral portion of the side wall of the trench as well as the lower portion of the trench, thereby severely interrupting the moving of a current. Therefore, according to the present embodiment, after the insulating-layer protective region 415 is first formed on the semiconductor layer 403, the trench 416 for the gate is formed.

Figure 38:
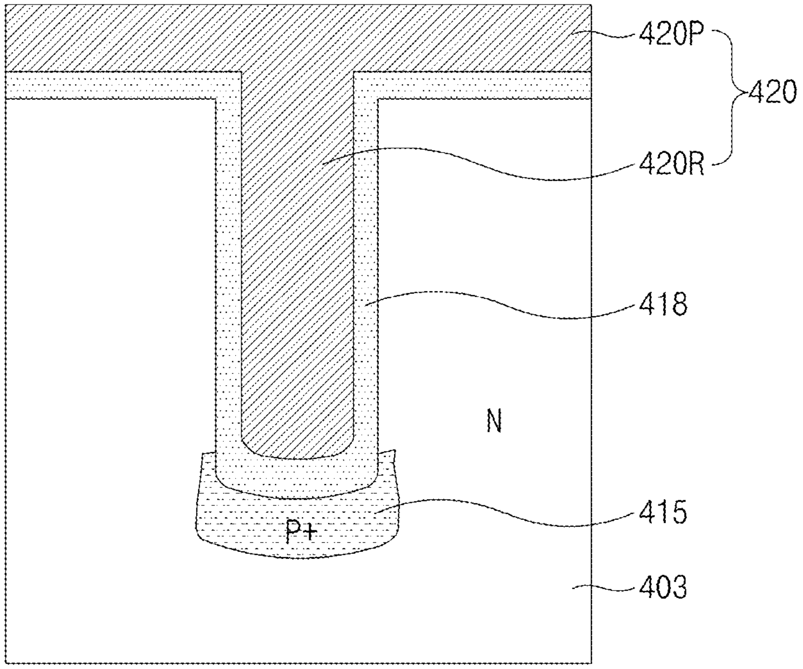

Thereafter, referring to FIG. 38, the gate insulating layers 418 may be formed on the bottom surface and the side surface of each trench 416 for the gate. The gate insulating layer 418 may be formed on the semiconductor layer 403 which is an outer portion of the trench 416. The gate insulating layer 418 may be formed to include an oxide formed by oxidizing the semiconductor layer 403 or may be formed by depositing an insulating material, such as an oxide or a nitride, on the semiconductor layer 403. The whole thickness of the gate insulating layer 418 may be uniform, or a portion of the gate insulating layer 418 formed on the bottom surface of the trench 416 may be thicker than a portion of the gate insulating layer 418 formed on a side wall of the trench 416, such that an electric field is reduced at a bottom part of the trench 316.

Thereafter, the gate electrode layer 420 may be formed by providing a gate electrode material onto the gate insulating layer 418 such that the trenches 416 for a gate is buried. The gate electrode layer 420 may be formed by implanting impurities into polysilicon or may be formed to include conductive metal or a metal silicide.

FIGS. 39 to 43 are perspective views schematically illustrating a method for fabricating an insulating-layer protective region surrounding a lower portion of a recess gate, according to another embodiment of the present disclosure.

Figure 39:
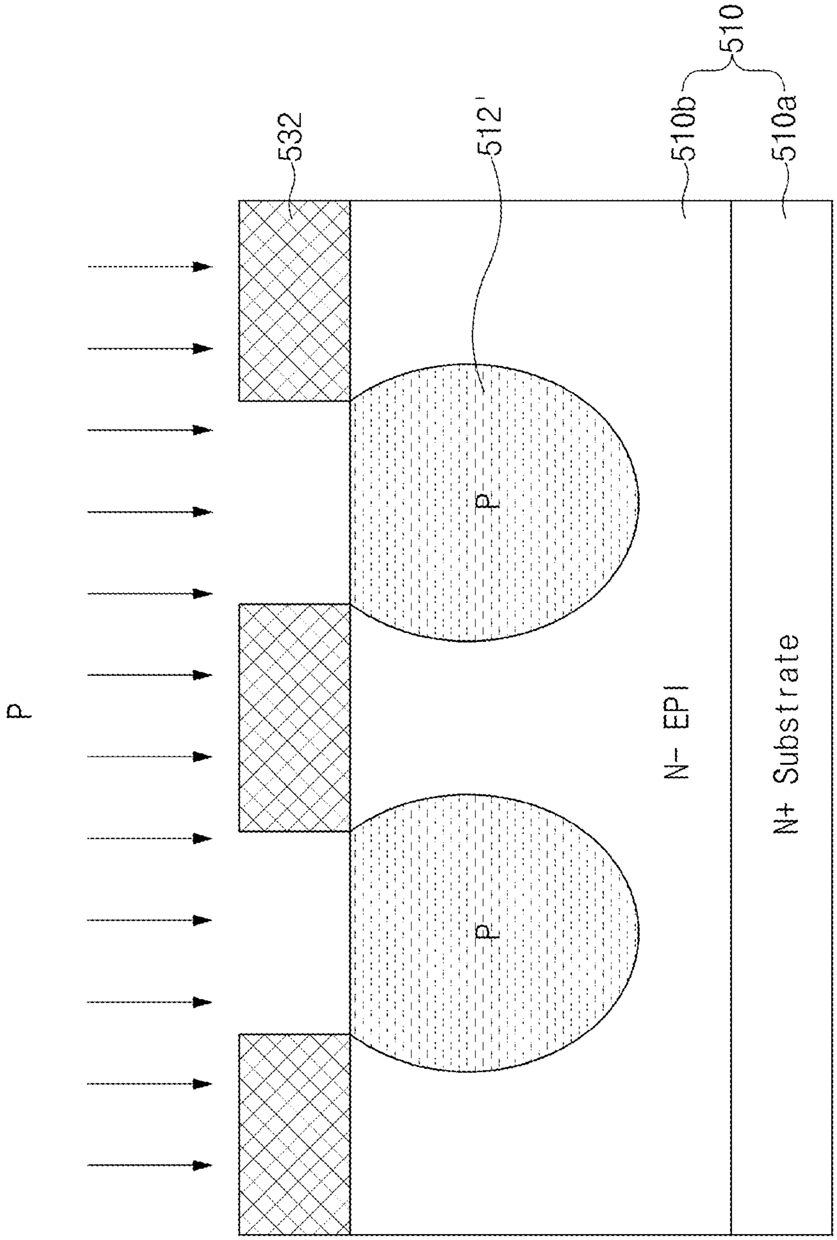
FIGS. 39 to 43 are perspective views schematically illustrating a method for fabricating an insulating-layer protective region surrounding a lower portion of the recess gate, according to another embodiment of the present disclosure.

Referring to FIG. 39, a mask pattern 532 may be formed on the semiconductor layer 510.

For example, after an insulating layer (for example, an oxide layer) (not illustrated) is formed on an entire portion of the semiconductor layer 510, the insulating layer is patterned to expose a region for forming an insulating layer protective region, thereby forming a hard mask pattern 532. The patterning for the insulating layer may be performed through a lithography process.

In this case, the mask pattern 532 may include a photoresist layer pattern. For example, the photoresist layer pattern 532 may be formed to expose a region for forming the insulating-layer protective region by performing an exposing and developing process after forming the photoresist layer on the semiconductor layer 510.

The semiconductor layer 510 may include a structure in which a silicon carbide (SiC) substrate layer 510*a* including the first conductive type of impurities and a SiC-epitaxial layer 510*b* are stacked. The silicon carbide (SiC) substrate layer 510*a* may include the first conductive type (N+) of impurities at a higher concentration, and the epitaxial layer 510*b* may include the first conductive type (N−) of impurities at a lower concentration.

Thereafter, a sacrificial impurity region 512' may be formed in the semiconductor layer 510 by implanting the second conductive type of impurities into the semiconductor layer 510 using the mask pattern 532 as an ion implanting barrier layer. The sacrificial impurity region 512' may be formed to be deeper than a bottom surface of a trench for a gate, which is to be formed in the subsequent process. The sacrificial impurity region 512' may include the second conductive type (P+) of impurities at a higher concentration.

However, when higher-concentration impurities are implanted into the epitaxial layer 510*b*, the first sacrificial impurity region 512' may be formed over a region wider than the region for the trench for a gate to be formed in the subsequent process due to diffusion of the impurities. For example, the first sacrificial impurity region 512' may not be formed to surround only the lower portion of the trench for the gate to be formed in the subsequent process, but may be formed to have a size that entirely surrounds the trench for the gate. In this case, when the power semiconductor device operates, the resistance (JFET resistance) in the moving path of the current may be greatly increased.

Figure 40:
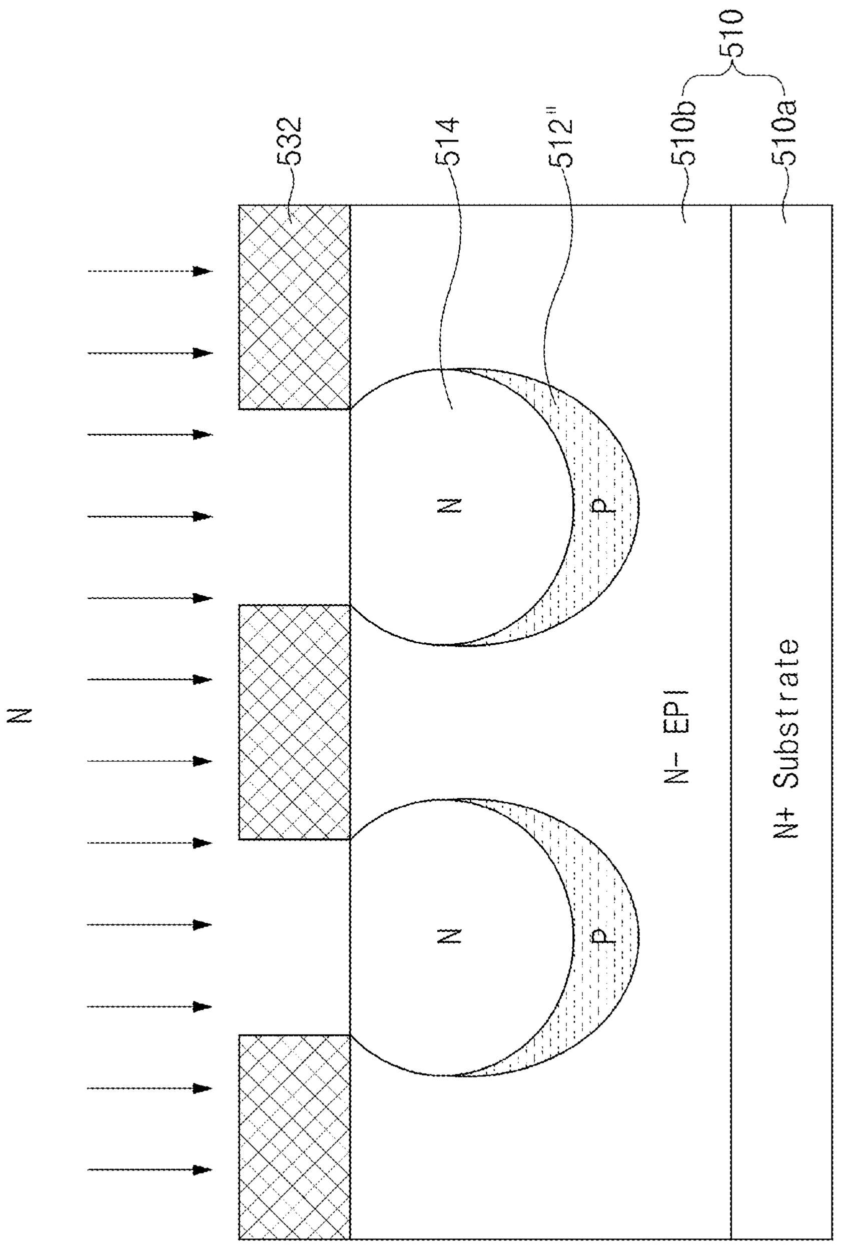

Next, referring to FIG. 40, to prevent an increase in resistance due to diffusion of impurities described above, the first conductive type of impurities are implanted into the semiconductor layer 510 using the mask pattern 532 as an ion implanting barrier layer again.

For example, a second sacrificial impurity region 512" may be formed, as an impurity region 514 for removing impurities is formed by implanting the first conductivity type of impurities into the semiconductor layer 510, such that a remaining portion of the first sacrificial impurity region 512' is removed except for a lower region. In this case, the region 514 for removing impurities may include impurities at a concentration higher than the concentration of the epitaxial layer 510*b*.

Figure 41:
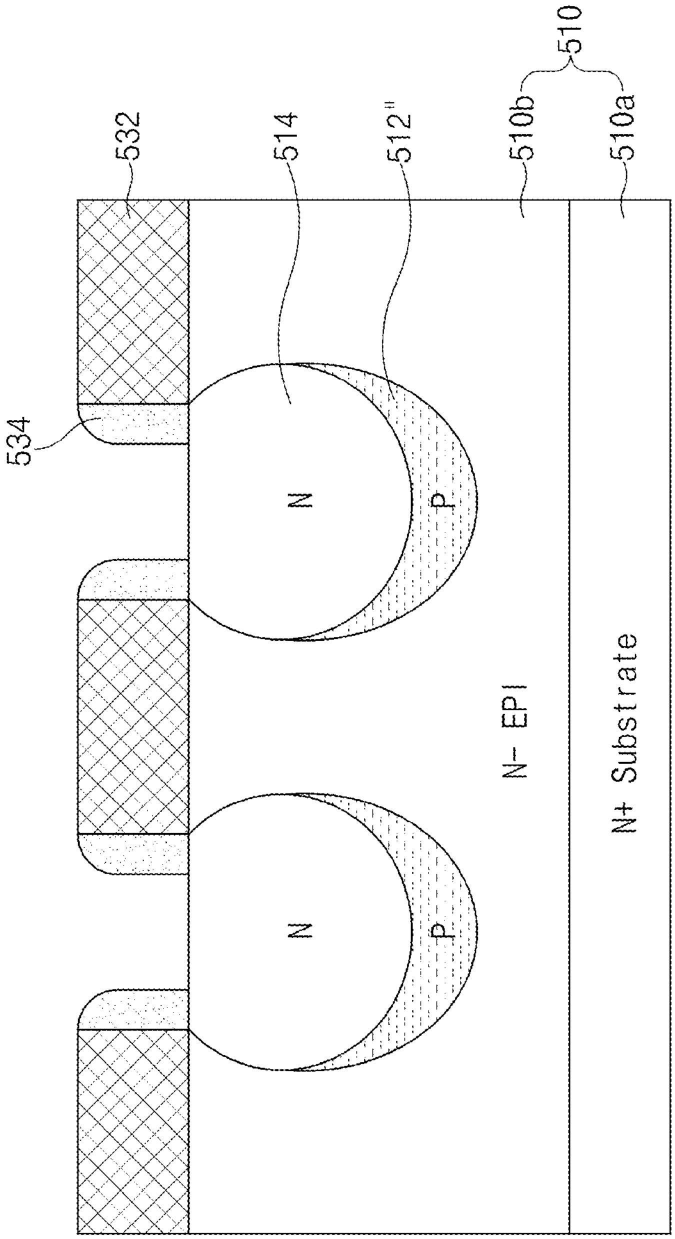

Referring to FIG. 41, a spacer 534 may be formed on a side surface of the mask pattern 532.

For example, after an insulating layer (not illustrated) is conformally formed on the mask pattern 532 and a portion, which is exposed by the mask pattern 532, of the semiconductor layer 510, anisotropic etching is performed with respect to the insulating layer for the spacer to expose the surface of the semiconductor layer 510, such that the spacer 534 may be formed on the sidewall of the mask pattern 532.

Figure 42:
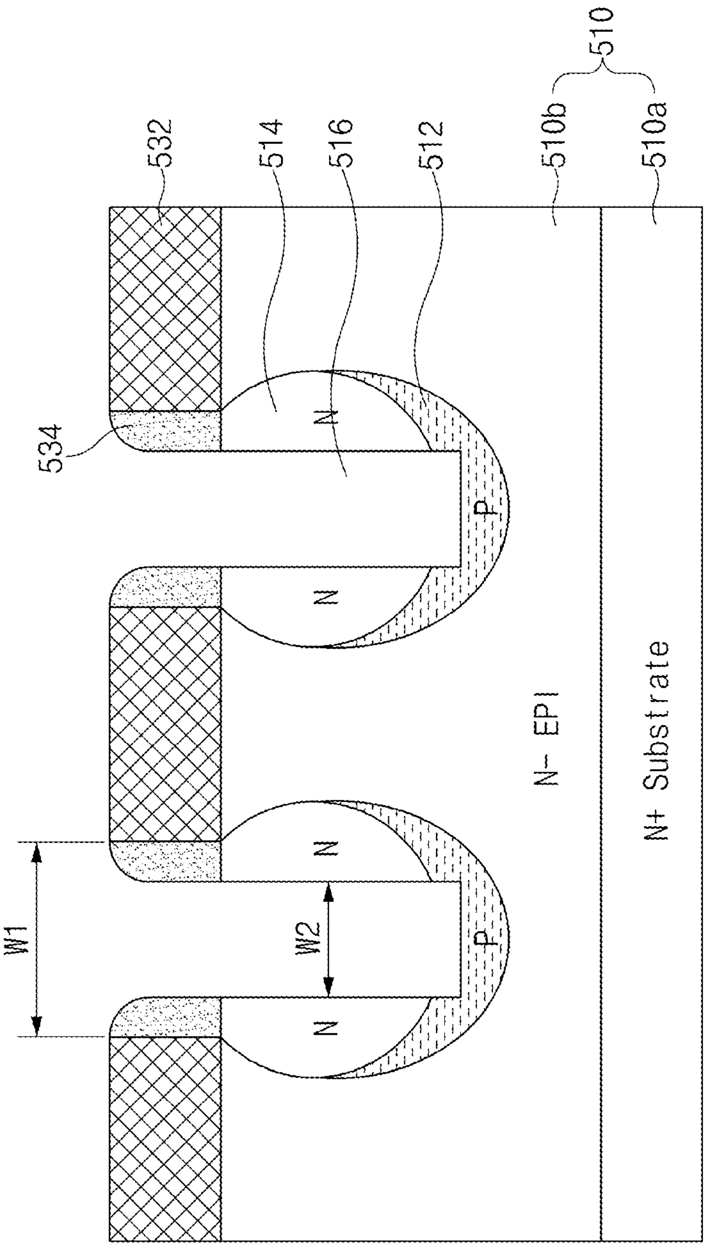

Next, referring to FIG. 42, the trench 516 for a gate and the insulating-layer protective region 512 may be formed by etching the impurity region 514 to be removed, and the second sacrificial impurity region 512" to a specific depth using the mask pattern 532 and the spacer 534 as the etching barrier layer. In this case, the trench 516 for the gate may be formed such that the bottom surface of the trench 516 is positioned in the insulating-layer protective region 512.

According to the present embodiment, after forming the spacer 534 on a side surface of the mask pattern 532, the mask pattern 532 and the spacer 534 are used as the etching barrier layer to form the trench 516 for the gate. Accordingly, the trench 516 for the gate may be formed to have a width W2 narrower than a width W1 of a region exposed by the mask pattern 532.

When the trench for the gate is formed using the mask pattern 532 as the etching barrier layer, the first sacrificial impurity region 512' has to be formed to be wider than that of FIG. 38 described above, such that the insulating-layer protective region 512 sufficiently surrounds a lower corner region of the trench for the gate. In this case, when the spacing between adjacent trenches for the gate are narrow, the first sacrificial impurity regions 512' of the adjacent trenches for the gate are jointed with each other, which interrupts the movement of a current. Accordingly, when the spacing between the adjacent trenches for the gate are sufficiently wide, the channel density of the power semiconductor device may be lowered.

To the contrary, according to the present embodiment, when the spacer 534 formed on the side surface of the mask pattern 532 is used, the width W2 of the gate trench 516 may be narrower than the width W1 of the region exposed by the mask pattern 532 to increase the width of the insulating-layer protective region 512. Accordingly, the channel density of the power semiconductor device may be increased.

Figure 43:
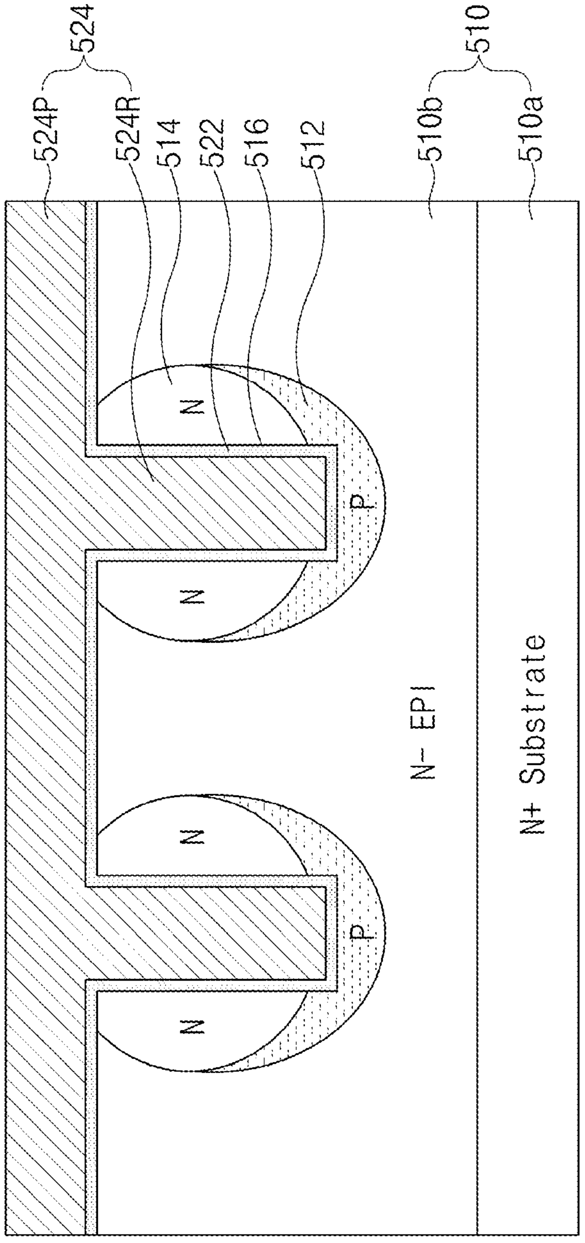

Thereafter, referring to FIG. 43, the gate insulating layers 522 may be formed on the bottom surface and the side surface of each trench 516 for the gate, after removing the mask pattern 532 and the spacer 534. The gate insulating layer 522 may be formed on the semiconductor layer 510 which is an outer portion of the trench 516 for the gate.

The gate insulating layer 522 may be formed to include an oxide formed by oxidizing the semiconductor layer 510 or may be formed by depositing an insulating material, such as an oxide or a nitride, on the semiconductor layer 510. The whole thickness of the gate insulating layer 522 may be uniform, or a portion of the gate insulating layer 522 formed on the bottom surface of the trench 516 may be thicker than a portion of the gate insulating layer 522 formed on a side wall of the trench 516, such that an electric field is reduced at a bottom part of the trench 516.

Thereafter, the gate electrode layer 524 may be formed by providing a gate electrode material onto the gate insulating layer 522 such that the trenches 516 for a gate are buried. The gate electrode layer 524 may be formed by implanting impurities into polysilicon or may be formed to include conductive metal or a metal silicide.

Figure 44:
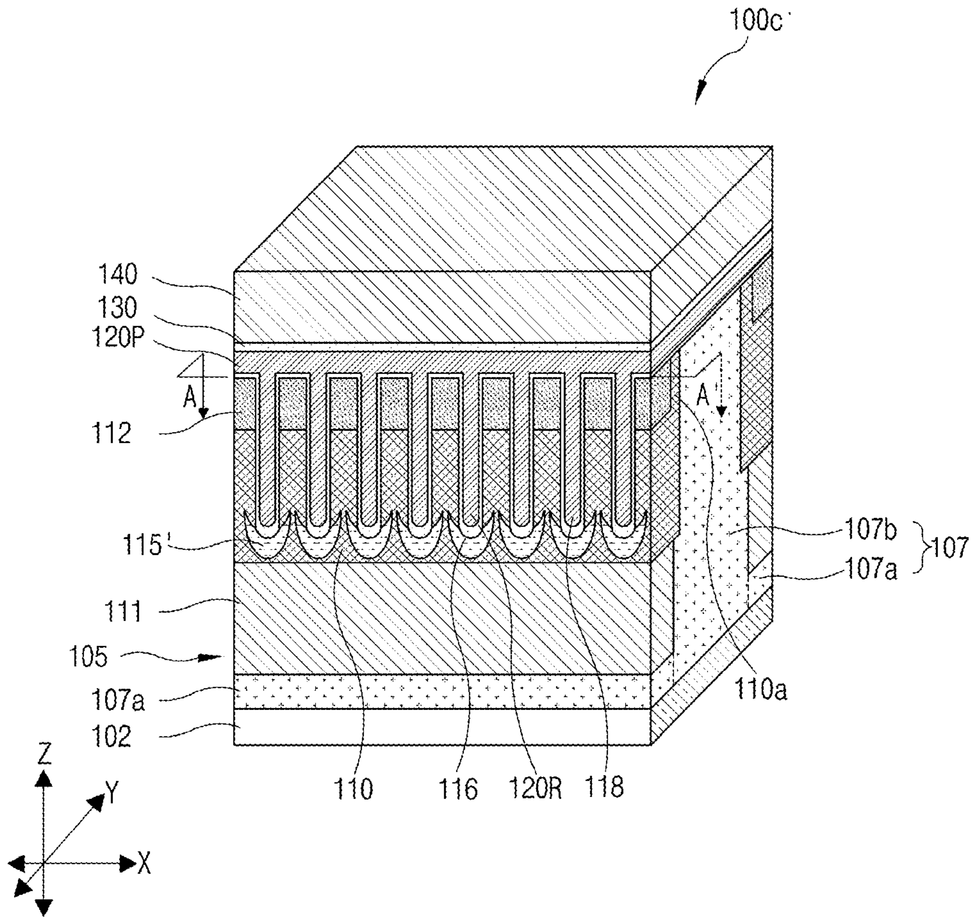
FIG. 44 is a schematic perspective view illustrating the structure of a power semiconductor device, according to another embodiment of the present disclosure.

FIG. 44 is a schematic perspective view illustrating the structure of a power semiconductor device, according to another embodiment of the present disclosure.

Referring to FIG. 44, the power semiconductor device 100*c'* differs from the power semiconductor device 100*c* of FIG. 10 in terms of the structure of an insulating-layer protective region 115'. For example, the insulating-layer protective region 115' of the power semiconductor device 100*c'* may be formed in the same shape as that of the insulating-layer protective region 512 in FIG. 43 described above.

As described above, according to an embodiment of the present disclosure, in the power semiconductor device and the method for fabricating the same, the concentration of the electric field to the corner part of the gate layer may be mitigated, the channel resistance may be reduced, and the channel density may be increased, such that the integration degree may be increased.

Of course, these effects are exemplary, and the scope of the present disclosure is not limited by these effects.

However, this is only an example embodiment, and it will be understood that various modifications and other equivalent embodiments are possible from this point by those skilled in the art. The technical protection scope of the present disclosure will be defined by the technical spirit of the appended claims.

Hereinabove, although the present disclosure has been described with reference to exemplary embodiments and the accompanying drawings, the present disclosure is not limited thereto, but may be variously modified and altered by those skilled in the art to which the present disclosure pertains without departing from the spirit and scope of the present disclosure claimed in the following claims.

What is claimed is:

1. A power semiconductor device comprising:

a semiconductor layer based on silicon carbide (SiC);

a vertical drift region positioned to extend in a vertical direction inside the semiconductor layer and having a first conductive type;

well regions positioned at two lateral sides of the vertical drift region to make contact with the vertical drift region in the semiconductor layer and having a second conductive type opposite to the first conductive type;

a plurality of recess gate electrodes extending from a surface of the semiconductor layer into the semiconductor layer and buried in the vertical drift region and the well regions to cross the vertical drift region and the well regions in a first direction perpendicular to the vertical direction, wherein the plurality of recess gate electrodes has a first end and a second end opposing the first end, the first end is further from the surface of the semiconductor layer than the second end, and the first end is buried in the well region;

a plate gate electrode positioned over the semiconductor layer, the plate gate electrode connecting the plurality of recess gate electrodes to each other, and the plate gate electrode having a width that is wider than a width of the vertical drift region;

a plurality of source regions positioned in the well regions between the plurality of recess gate electrodes and having the first conductive type; and a plurality of insulating-layer protective regions positioned at least under the plurality of recess gate electrodes, respectively, in the vertical drift region, and having the second conductive type.

2. The power semiconductor device of claim 1, wherein the insulating-layer protective regions surround the first end in the vertical drift region.

3. The power semiconductor device of claim 1, further comprising:

pillar regions positioned under the well regions and the plurality of recess gate electrodes inside the semiconductor layer to make contact with the vertical drift region and the well regions, and having the second conductive type.

4. The power semiconductor device of claim 3, wherein a first region of the vertical drift region has a first width wider than a second width of a second region of the vertical drift region, the first region is in contact with the pillar regions, and the second region is in contact with the well regions.

5. The power semiconductor device of claim 3, further comprising:

a horizontal drift region connected to the vertical drift region, and positioned under the pillar regions to make contact with the pillar regions.

6. The power semiconductor device of claim 4, further comprising, in a second direction, a channel region that is between the vertical drift region and a source region among the plurality of source regions, wherein the second direction crosses the first direction, wherein the vertical drift region extends from the surface of the semiconductor layer to an interior of the semiconductor layer in the vertical direction between the plurality of recess gate electrodes, wherein the width of the plate gate electrode is wider than each of the first width and the second width, and wherein the power semiconductor device further comprises a horizontal drift region extending from a side of the first region of the vertical drift region, and wherein the horizontal drift region contacts the pillar region.

7. The power semiconductor device of claim 1, wherein the well regions and the source regions are positioned at opposite sides of the vertical drift region to be symmetric to each other about the vertical drift region.

8. The power semiconductor device of claim 1, further comprising:

a source contact region disposed outside the recess gate electrodes and connected to the plurality of source regions.

9. The power semiconductor device of claim 8, further comprising:

a well contact region positioned in the source contact region and connected to the well region.

10. The power semiconductor device of claim 9, further comprising:

a source electrode layer connected to the source contact region and the well contact region.

11. The power semiconductor device of claim 1, wherein the plurality of recess gate electrodes are positioned to extend to a partial region of the well regions while passing through the vertical drift region in the first direction, and disposed to be spaced apart from each other in a second direction crossing the first direction.

12. The power semiconductor device of claim 1, wherein the plurality of insulating-layer protective regions are positioned to cross an entire portion of the vertical drift region in the first direction, and positioned to be spaced apart from each other without being connected to each other in a second direction crossing the first direction.

13. The power semiconductor device of claim 1, wherein the plate gate electrode is positioned on the semiconductor layer to cover the vertical drift region and the plurality of source regions.

14. The power semiconductor device of claim 1, wherein the plurality of source regions are positioned to be spaced apart from the vertical drift region.

15. The power semiconductor device of claim 1, wherein the plurality of source regions are positioned to make contact with the vertical drift region.

* * * * *